US 11,488,909 B2
United States Patent
Lin et al.

(10) Patent No.: US 11,488,909 B2
(45) Date of Patent: *Nov. 1, 2022

(54) PACKAGE STRUCTURE

(71) Applicant: Taiwan Semiconductor Manufacturing Co., Ltd., Hsinchu (TW)

(72) Inventors: Chun-Wen Lin, Changhua County (TW); Chung-Hao Tsai, Changhua County (TW); Chen-Hua Yu, Hsinchu (TW); Chuei-Tang Wang, Taichung (TW); Che-Wei Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/944,173

(22) Filed: Jul. 31, 2020

(65) Prior Publication Data
US 2020/0365517 A1    Nov. 19, 2020

Related U.S. Application Data

(63) Continuation of application No. 15/900,808, filed on Feb. 21, 2018, now Pat. No. 10,734,323.
(Continued)

(51) Int. Cl.
H01L 21/56    (2006.01)
H01L 23/538   (2006.01)
H01Q 1/22     (2006.01)
H01L 23/31    (2006.01)
H01L 23/66    (2006.01)
(Continued)

(52) U.S. Cl.
CPC ...... *H01L 23/5389* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 23/66* (2013.01);
(Continued)

(58) Field of Classification Search
CPC combination set(s) only.
See application file for complete search history.

(56) References Cited

U.S. PATENT DOCUMENTS 9,000,584 B2    4/2015   Lin et al.
9,048,222 B2    6/2015   Hung et al.
(Continued)

*Primary Examiner* — Hrayr A Sayadian
(74) *Attorney, Agent, or Firm* — JCIPRNET

(57) ABSTRACT

A package structure includes at least one integrated circuit component, an insulating encapsulation, and a redistribution structure. The at least one integrated circuit component includes a semiconductor substrate, an interconnection structure disposed on the semiconductor substrate, and signal terminals and power terminals located on and electrically connecting to the interconnection structure. The interconnection structure is located between the semiconductor substrate and the signal terminals and between the semiconductor substrate and the power terminals, and where a size of the signal terminals is less than a size of the power terminals. The insulating encapsulation encapsulates the at least one integrated circuit component. The redistribution structure is located on the insulating encapsulation and electrically connected to the at least one integrated circuit component.

20 Claims, 14 Drawing Sheets

Related U.S. Application Data

(60) Provisional application No. 62/590,257, filed on Nov. 22, 2017.

(51) Int. Cl.
 *H01L 23/00* (2006.01)
 *H01L 21/48* (2006.01)

(52) U.S. Cl.
 CPC ............. *H01L 24/19* (2013.01); *H01L 24/20* (2013.01); *H01Q 1/2283* (2013.01); *H01L 2223/6677* (2013.01); *H01L 2224/13101* (2013.01); *H01L 2224/18* (2013.01); *H01L 2224/214* (2013.01); *H01L 2224/81801* (2013.01); *H01L 2924/00014* (2013.01); *H01L 2924/19106* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 * | 11/2016 | Yu | H01L 25/0657 |
| 10,734,323 B2 * | 8/2020 | Lin | H01L 23/66 |
| 2014/0252646 A1 * | 9/2014 | Hung | H01L 21/76843 257/774 |

\* cited by examiner

PACKAGE STRUCTURE

CROSS-REFERENCE TO RELATED APPLICATION

This application is a continuation application of and claims the priority benefit of a prior application Ser. No. 15/900,808, filed on Feb. 21, 2018, now allowed, which claims the priority benefit of U.S. provisional application Ser. No. 62/590,257, filed on Nov. 22, 2017. The entirety of each of the above-mentioned patent applications is hereby incorporated by reference herein and made a part of this specification.

BACKGROUND

Semiconductor devices and integrated circuits used in a variety of electronic applications, such as cell phones and other mobile electronic equipment, are typically manufactured on a signal semiconductor wafer. The semiconductor chips of the wafer may be processed and packaged with other semiconductor devices, semiconductor chips, semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
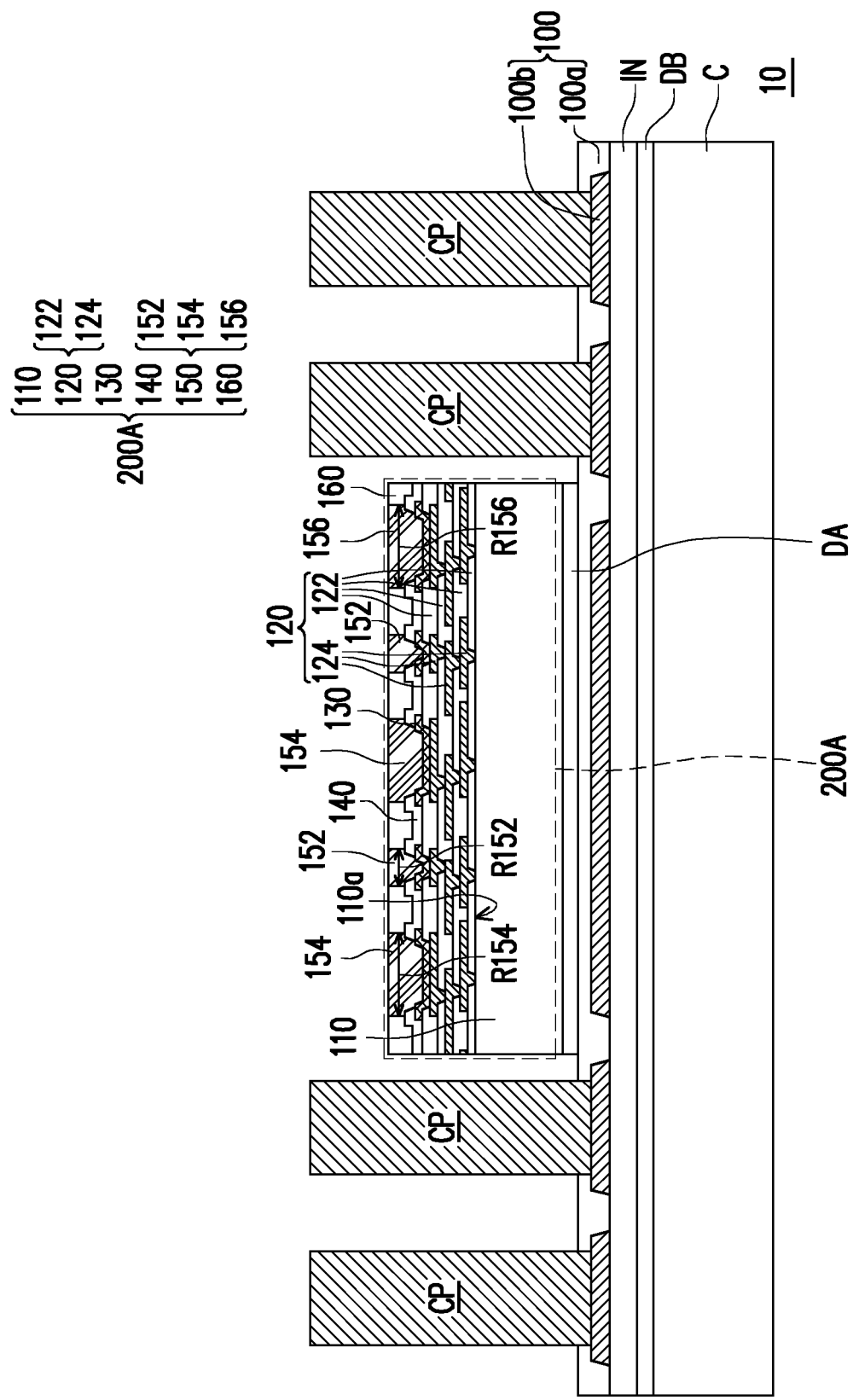
FIG. 1 to FIG. 6 are schematic cross sectional views of various stages in a manufacturing method of a package structure in accordance with some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 6 are schematic cross sectional views of various stages in a manufacturing method of a package structure in accordance with some exemplary embodiments of the present disclosure. FIG. 7 is a schematic bottom view illustrating a relative position between a metallization layer of an interconnection structure, connecting pads, connecting vias, and a metallization layer of a redistribution structure of a package structure in accordance with some exemplary embodiments of the present disclosure, where FIG. 7 is an enlarged schematic bottom view showing the positioning configuration of an interconnection structure (e.g. a topmost metallization layer), connecting pads, connecting vias, and a redistribution structure (e.g. a bottommost metallization layer) of the package structure 10 depicted in FIG. 6 (indicated by a dotted box X). In FIG. 1 to FIG. 6, a package structure 10 is shown to represent a package structure obtained following the manufacturing method, for example. In exemplary embodiments, the manufacturing method is part of a wafer level packaging process. It is to be noted that the processing steps described herein cover a portion of the manufacturing processes used to fabricate a package structure. The embodiments are intended to provide further explanations but are not used to limit the scope of the present disclosure. In FIG. 1 to FIG. 6, one integrated circuit component is shown to represent signal or plural integrated circuit components, the disclosure is not limited thereto. In other embodiments, two or more integrated circuit components are shown to represent plural integrated circuit components, and two or more package structures 10 are shown to represent plural package structures obtained following the (semiconductor) manufacturing method, the disclosure is not limited thereto.

Referring to FIG. 1, in some embodiments, a carrier C having a de-bonding layer DB and an insulating layer IN formed thereon is provided. In some embodiments, the de-bonding layer DB is between the carrier C and the insulating layer IN. In some embodiments, the carrier C is a glass substrate, the de-bonding layer DB is a light-to-heat conversion (LTHC) release layer formed on the glass substrate, and the insulating layer IN is a polybenzoxazole (PBO) layer formed on the de-bonding layer DB, for example. It is noted that the formation of the insulating layer IN is optional in some alternative embodiments. It may also be noted that materials for the carrier C, the de-bonding layer DB, and the insulating layer IN are not limited to what are disclosed herein according to the disclosure.

In some embodiments, after the carrier C having the de-bonding layer DB and the insulating layer IN formed thereon is provided, a redistribution structure 100 is formed over the carrier C, and then a plurality of conductive pillars CP and one or more integrated circuit components 200A are formed on the redistribution structure 100. The numbers of the conductive pillars CP and the integrated circuit components 200A may be selected based on demand, and are not limited in the disclosure. For example, in FIG. 1, the redistribution structure 100 is formed on the insulating layer IN, and the formation of the redistribution structure 100 includes sequentially forming one or more polymer dielectric layers 100a and one or more metallization layers 100b in alternation. In some embodiments, the redistribution structure 100 includes one polymer dielectric layer 100a and one metallization layer 100b as shown in FIG. 1; however, the disclosure is not limited thereto. The numbers of the metallization layers and the polymer dielectric layers included in the redistribution structure 100 is not limited thereto. For example, the numbers of the metallization layers and the polymer dielectric layers may be one or more than one.

As shown in FIG. 1, for example, a bottom surface of the metallization layer 100b is covered by the insulating layer IN, and portions of a top surface of the metallization layer 100b are exposed by the polymer dielectric layer 100a for connecting the conductive pillars CP. Due to the configuration of the redistribution structure 100, a routing function is provided to the package structure 10. The redistribution structure 100 is referred as a back-side redistribution structure of the integrated circuit component 200A, for example.

In certain embodiments, as shown in FIG. 1, the metallization layer 100b is disposed on the insulating layer IN and covered by the polymer dielectric layer 100a. In some embodiments, the material of the polymer dielectric layer 100a may include polyimide, epoxy resin, acrylic resin, phenol resin, benzocyclobutene (BCB), polybenzoxazole (PBO), or any other suitable polymer-based dielectric material, and the polymer dielectric layer 100a may be formed by deposition. In some embodiments, the material of the metallization layer 100b may include aluminum, titanium, copper, nickel, tungsten, and/or alloys thereof, and the metallization layer 100b may be formed by electroplating or deposition. The disclosure is not limited thereto.

In some embodiments, after the redistribution structure 100 is formed on the insulating layer IN, the conductive pillars CP are formed on the redistribution structure 100. In some embodiments, the conductive pillars CP are formed over the carrier C (e.g., directly on the insulating layer IN) by photolithography, plating, and photoresist stripping process. In some alternative embodiments, the conductive pillars CP are pre-fabricated through other processes and are mounted over the carrier C. For example, the conductive pillars CP include copper posts or other metallic posts.

Continued on FIG. 1, in some embodiments, the integrated circuit component 200A is picked-up and placed on the insulating layer IN carried by the carrier C. In some embodiments, the integrated circuit component 200A is attached or adhered on the insulating layer IN through a connecting film DA. For example, the connecting film DA may be a die attach film, an adhesion paste or the like. In some embodiments, the integrated circuit component 200A may have a thickness less than a height of the conductive pillars CP, as shown in FIG. 1. However, the disclosure is not limited thereto. In an alternative embodiment, the thickness of the integrated circuit component 200A may be greater than or substantially equal to the height of the conductive pillars CP. As shown in FIG. 1, the integrated circuit component 200A may be picked-up and placed on the insulating layer IN after the formation of the conductive pillars CP. However, the disclosure is not limited thereto. In an alternative embodiment, the integrated circuit component 200A may be picked-up and placed on the insulating layer IN before the formation of the conductive pillars CP. The cross-sectional shape of the conductive pillars CP may be selected based on demand, and are not limited in the disclosure.

As shown in FIG. 1, the integrated circuit component 200A includes a semiconductor die 110 having an active surface 110a, an interconnection structure 120 formed on the active surface 110a, contact pads 130 formed on the interconnection structure 120, a protection layer 140 partially covering the contact pads 130, connecting vias 150 connecting to the contact pads 130 partially exposed by the protection layer 140, and a passivation layer 160 disposed on the protection layer 140 and wrapping at least sidewalls of the connecting vias 150.

In some embodiments, the semiconductor die 110 may be a silicon substrate including active components (e.g., transistors or the like) and/or passive components (e.g., resistors, capacitors, inductors or the like) formed therein. The disclosure is not limited thereto.

In some embodiments, the interconnection structure 120 includes the interconnection structure 120 includes one or more inter-dielectric layers 122 and one or more patterned conductive layers 124 stacked alternately. In certain embodiments, the patterned conductive layers 124 are sandwiched between the inter-dielectric layers 122, where a top surface of a topmost layer of the patterned conductive layers 124 is exposed by a topmost layer of the inter-dielectric layers 122 and physically connected to the contact pads 130, and a bottommost layer of the patterned conductive layers 124 is exposed by a bottommost layer of the inter-dielectric layers 122 and electrically connected to the active components and/or passive components (not shown) formed in the semiconductor die 110. As shown in FIG. 1, the bottommost layer of the inter-dielectric layers 122 is located on the active surface 110a of the semiconductor die 110, and the topmost layer of the inter-dielectric layers 122 is at least partially in contact with the contact pads 130. The numbers of the inter-dielectric layers 122 and the patterned conductive layers 124 may be selected based on demand, and are not limited in the disclosure.

In one embodiment, the inter-dielectric layers 122 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the inter-dielectric layers 122 may be formed by suitable fabrication techniques such as spin-on coating, chemical vapor deposition (CVD), plasma-enhanced chemical vapor deposition (PECVD) or the like. In one embodiment, the patterned conductive layers 124 may be made of conductive materials formed by electroplating or deposition, such as copper, copper alloy, aluminum, aluminum alloy, or combinations thereof, which may be patterned using a photolithography and etching process. In some embodiments, the patterned conductive layers 124 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the contact pads 130 may be aluminum pads, copper pads or other suitable metal pads, and may be formed by an electroplating process. In some embodiments, a size of the contact pads 130 is ranging approximately from 10 μm to 80 μm, the disclosure is not limited thereto. In some embodiments, in a plane view of the package structure 10 along a stacking direction of the semiconductor die 110, the interconnection structure 120, the contact pads 130 and connecting vias 150, the contact pads 130 may be in a polygon-shape (see the bottom view depicted in FIG. 7), a circle-shape, an ellipse-shape, a triangle-shape, a rectangle-shape, or the like. The number and shape of the contact pads 130 may be selected based on demand, and are not limited in the disclosure.

In some embodiments, the protection layer 140 and/or the passivation layer 160 may be a silicon oxide layer, a silicon nitride layer, a silicon oxy-nitride layer or a dielectric layer formed by other suitable dielectric materials, and may be formed by an electroplating process. In some embodiments, the protection layer 140 and/or the passivation layer 160 may be a polyimide (PI) layer, a polybenzoxazole (PBO) layer, or a dielectric layer formed by other suitable polymers, and may be formed by an coating process. The disclosure is not limited thereto. In one embodiment, the material of the protection layer 140 and the passivation layer 160 may be the same. In an alternative embodiment, the materials of the protection layer 140 and the passivation layer 160 may be different.

In some embodiments, the connecting vias 150 includes one or more signal connecting vias 152, one or more ground connecting vias 154, and one or more power connecting vias 156. In some embodiments, a size R152 of each of the signal connecting vias 152, a size R154 of each of the ground connecting vias 154 and a size R156 of the power connecting via 156 are ranging approximately from 10 μm to 80 μm, the disclosure is not limited thereto. As shown in FIG. 1, only two signal connecting vias 152, only two ground connecting vias 154, and only one power connecting via 156 are presented in FIG. 1 for illustrative purposes, however, it should be noted that the numbers of the signal connecting vias 152, the ground connecting vias 154, and the power connecting via 156 may be selected or designated based on the demand and the design layout; the disclosure is not limited thereto.

As shown in FIG. 1, in some embodiments, the signal connecting vias 152 are electrically connected to the interconnection structure 120 through physically contacting the topmost layer of the patterned conductive layers 124 exposed by the topmost layer of the inter-dielectric layers 122 and a respective one of the contact pads 130, the ground connecting vias 154 are electrically connected to the interconnection structure 120 through physically contacting the topmost layer of the patterned conductive layers 124 exposed by the topmost layer of the inter-dielectric layers 122 and a respective one of the contact pads 130, and the power connecting via 152 is electrically connected to the interconnection structure through physically contacting the topmost layer of the patterned conductive layers 124 exposed by the topmost layer of the inter-dielectric layers 122 and a respective one of the contact pads 130. However, the disclosure is not limited thereto. In some alternative embodiments, the contact pads 130 may be omitted.

In some embodiments, the signal connecting vias 152, the ground connecting vias 154, and the power connecting via 156 may include copper pillars, copper alloy pillars or other suitable metal pillars, and may be formed by an electroplating process or the like. In one embodiment, the materials of the signal connecting vias 152, the ground connecting vias 154, and the power connecting via 156 may be the same. In an alternative embodiment, the materials of the signal connecting vias 152, the ground connecting vias 154, and the power connecting via 156 may be different. In some embodiments, in the plane view of the package structure 10 along the stacking direction of the semiconductor die 110, the interconnection structure 120, the contact pads 130 and connecting vias 150, the signal connecting vias 152, the ground connecting vias 154, and the power connecting via 156 may be in a circle-shape (see the bottom view depicted in FIG. 7), an ellipse-shape, a triangle-shape, a rectangle-shape, or the like. In one embodiment, the shapes of the signal connecting vias 152, the ground connecting vias 154, and the power connecting via 156 may be the same. In an alternative embodiment, the shapes of the signal connecting vias 152, the ground connecting vias 154, and the power connecting via 156 may be the different from one another, and the disclosure is not limited thereto.

Figure 2:
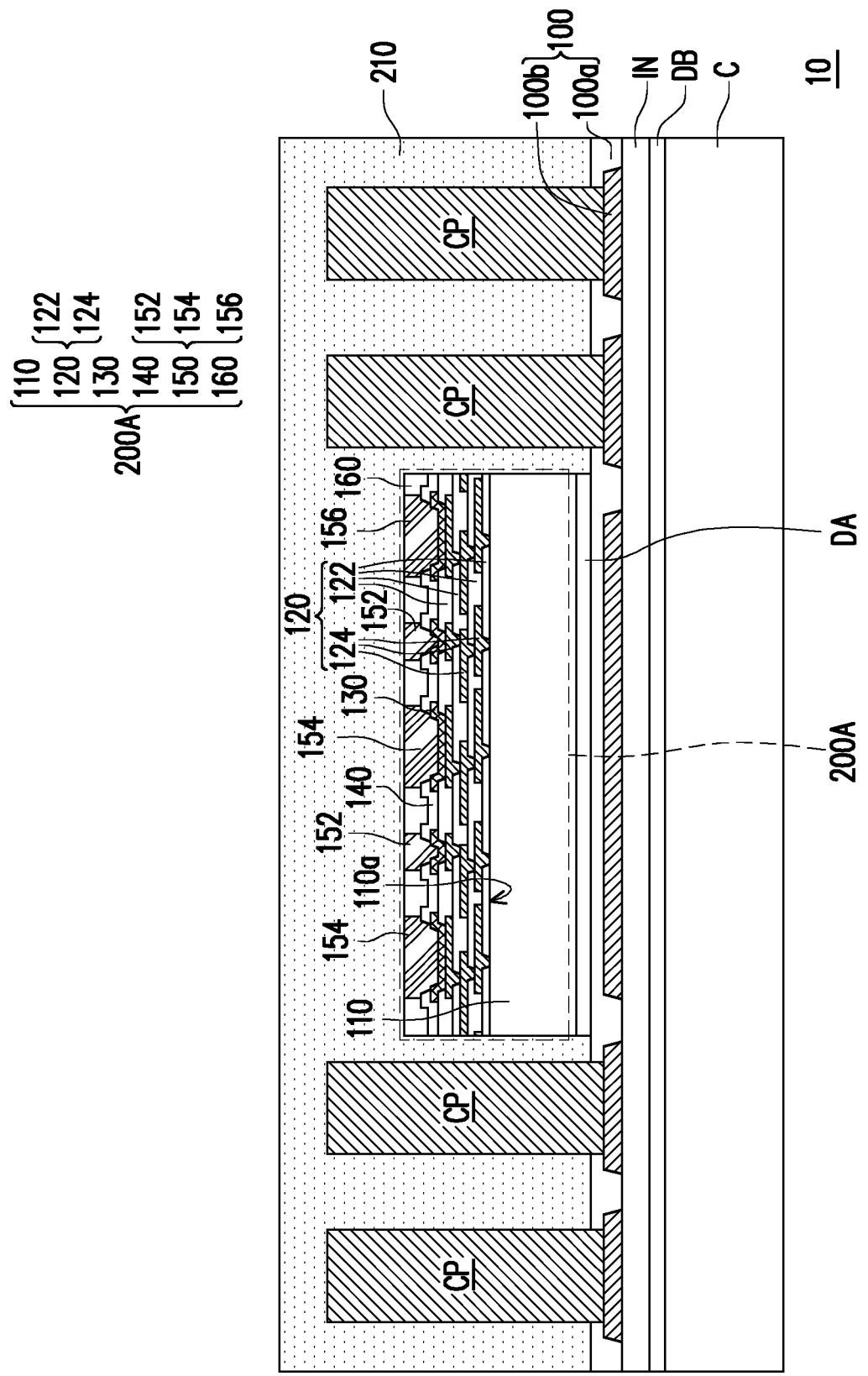

Referring to FIG. 2, an insulating encapsulation 210 is formed over the carrier C (e.g., on the insulating layer IN) to encapsulate the integrated circuit component 200A and the conductive pillars CP. In other words, the integrated circuit component 200A and the conductive pillars CP are covered by and embedded in the insulating encapsulation 210. That is, the integrated circuit component 200A and the conductive pillars CP are not accessibly exposed by the insulating encapsulation 210. In some embodiments, the insulating encapsulation 210 is a molding compound formed by a molding process, and the material of the insulating encapsulation 210 may include epoxy or other suitable resins. For example, the insulating encapsulation 210 may be epoxy resin containing chemical filler(s).

Figure 3:
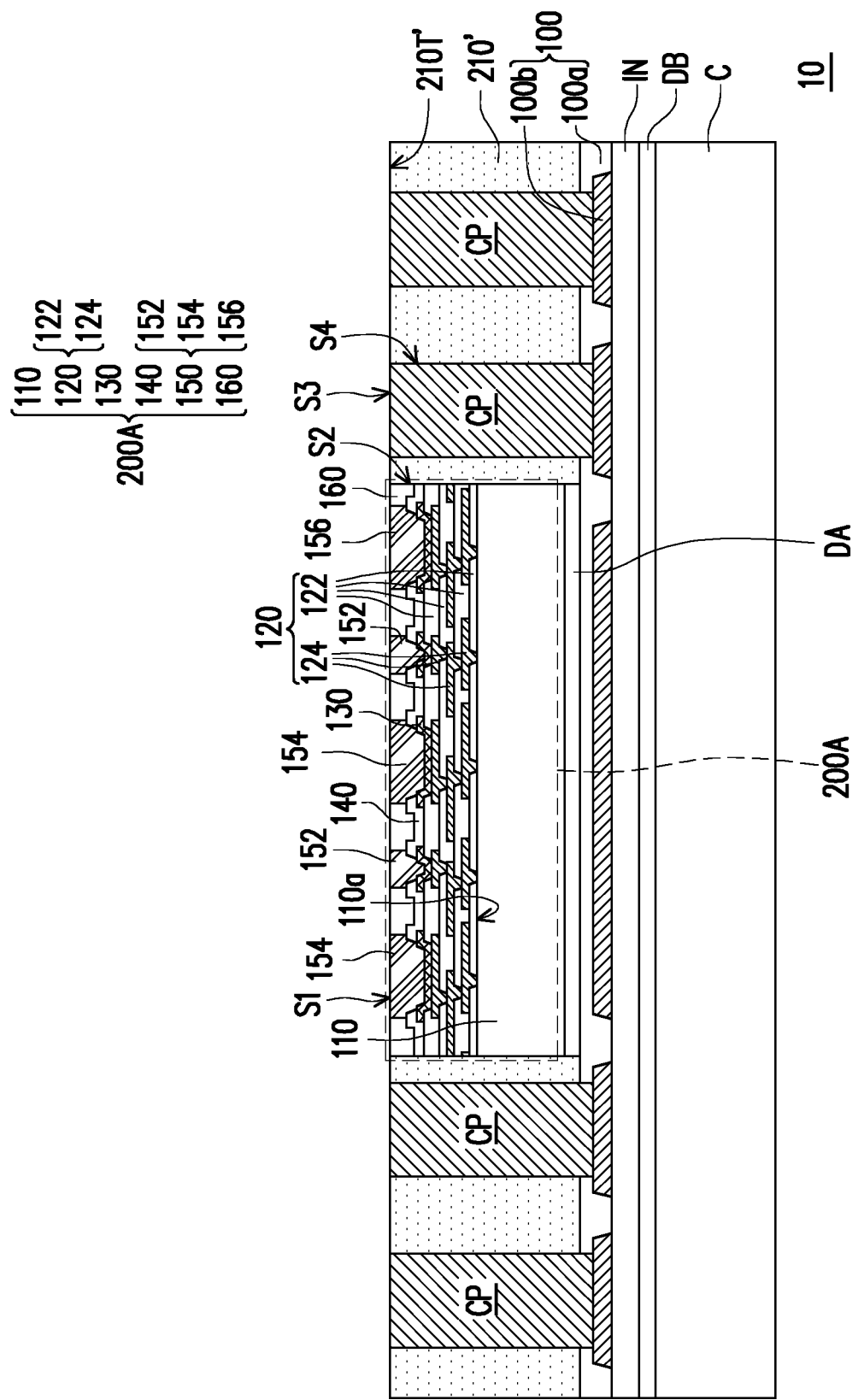

Referring to FIG. 2 and FIG. 3, in some embodiments, the insulating encapsulation 210 is planarized until a top surface Si of the integrated circuit component 200A (e.g., top surfaces of the signal connecting vias 152, the ground connecting vias 154, the power connecting via 156, and the passivation layer 160) and top surfaces S3 of the conductive pillars CP are exposed. After the insulating encapsulation 210 is planarized, a planarized insulating encapsulation 210' is formed over the carrier C (e.g., on the insulating layer IN). That is, the signal connecting vias 152, the ground connecting vias 154 and the power connecting via 156 of the integrated circuit component 200A and the conductive pillars CP are accessibly exposed by the insulating encapsulation 210'. During the planarized process of the insulating encapsulation 210 (shown in FIG. 3), the conductive pillars CP are also planarized. In some embodiments, as shown in FIG. 3, during the planarized process of the insulating encapsulation 210, a portion of the passivation layer 160 and portions of the signal connecting vias 152, the ground connecting vias 154, and the power connecting via 156 may be planarized, also. The planarized insulating encapsulation 210' may be formed by mechanical grinding or chemical mechanical polishing (CMP), for example. After the planarizing process, a cleaning step may be optionally performed, for example to clean and remove the residue generated from the planarizing step. However, the disclosure is not limited thereto, and the planarizing step may be performed through any other suitable method.

In some embodiments, as shown in FIG. 3, the planarized insulating encapsulation 210' physically contacts a sidewall S2 of the integrated circuit component 200A and sidewalls S4 of the conductive pillars CP. In other words, the integrated circuit component 200A and the conductive pillars CP are mostly embedded in the planarized insulating encapsulation 210' with only the top surface S1 of the integrated circuit component 200A and the top surface S3 of the conductive pillars CP being accessibly exposed. In certain embodiments, the top surfaces of the signal connecting vias 152, the ground connecting vias 154, and the power connecting via 156 of the integrated circuit component 200A and the top surfaces S3 of the conductive pillars CP are substantially levelled with a top surface 210T' of the planarized insulating encapsulation 210'. In other words, the top surfaces of the signal connecting vias 152, the ground connecting vias 154, and the power connecting via 156 of the integrated circuit component 200A, the top surfaces S3 of the conductive pillars CP, and the top surface 210T' of the planarized insulating encapsulation 210' are substantially coplanar with each other.

Figure 4:
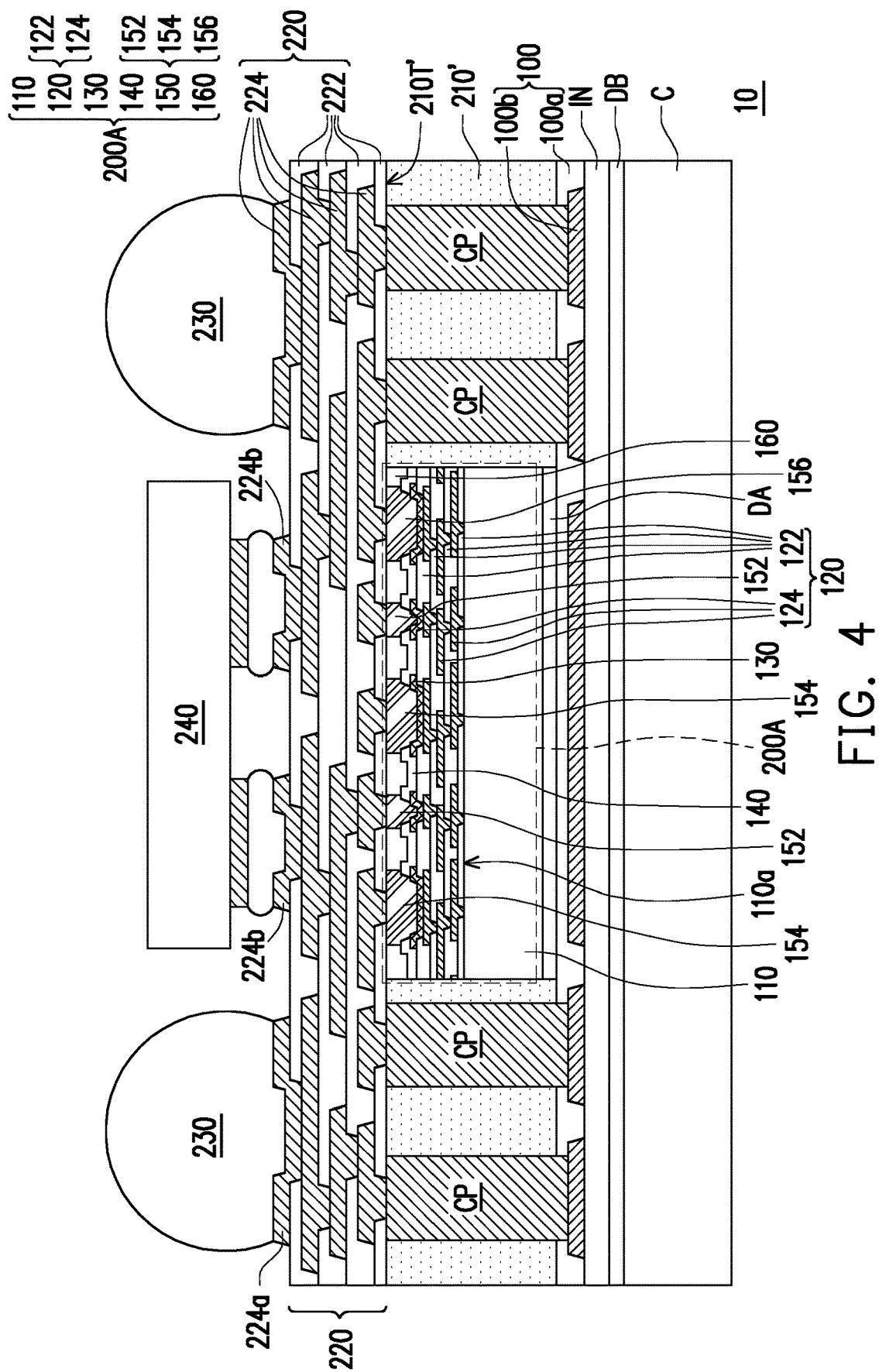

Referring to FIG. 4, in some embodiments, after the planarized insulating encapsulation 210' is formed, a redistribution structure 220 is formed on the planarized insulating encapsulation 210'. In some embodiments, the redistribution structure 220 is formed on the top surface 210T' of the planarized insulating encapsulation 210', the top surfaces S3 of the conductive pillars CP, and the top surfaces of the signal connecting vias 152, the ground connecting vias 154, and the power connecting via 156. In certain embodiments, the redistribution structure 220 is fabricated to electrically connect with one or more connectors underneath. Here, the afore-said connectors may be the signal connecting vias 152, the ground connecting vias 154, and the power connecting via 156 of the integrated circuit component 200A and the conductive pillars CP embedded in the planarized insulating encapsulation 210', for example. In other words, the redistribution structure 220 is electrically connected to the top surfaces S3 of the conductive pillars CP, and the top surfaces of the signal connecting vias 152, the ground connecting vias 154, and the power connecting via 156.

Continued on FIG. 4, in some embodiments, the redistribution structure 220 includes a plurality of inter-dielectric layers 222 and a plurality of patterned redistribution conductive layers 224 stacked alternately. In certain embodiments, the patterned redistribution conductive layers 224 are sandwiched between the inter-dielectric layers 222, where a top surface of a topmost layer of the patterned redistribution conductive layers 224 is exposed by a topmost layer of the inter-dielectric layers 222 and physically connected to with one or more overlying connectors (e.g. later-formed conductive terminal(s) or semiconductor device(s) such as passive element(s)), and a bottommost layer of the patterned redistribution conductive layers 224 exposed by a bottommost layer of the inter-dielectric layer 222 are electrically connected to with one or more underlying connectors (e.g. the signal connecting vias 152, the ground connecting vias 154 and the power connecting via 156 of the integrated circuit component 200A and the conductive pillars CP embedded in the planarized insulating encapsulation 210'). As shown in FIG. 4, in some embodiments, the top surfaces of the signal connecting vias 152, the ground connecting vias 154 and the power connecting via 156 of the integrated circuit component 200A and the top surfaces S3 of the conductive pillars CP are in direct contact with the redistribution structure 220 (e.g. the bottommost layer of the patterned redistribution conductive layers 224 exposed by the bottommost layer of the inter-dielectric layer 222). In such embodiments, the top surfaces of the signal connecting vias 152, the ground connecting vias 154 and the power connecting via 156 of the integrated circuit component 200A and the top surfaces S3 of the conductive pillars CP are in physical contact with the bottommost layer of the patterned redistribution conductive layers 224. In some embodiments, as shown in FIG. 4, the top surfaces of the signal connecting vias 152, the ground connecting vias 154 and the power connecting via 156 of the integrated circuit component 200A and the top surfaces S3 of the conductive pillars CP are partially covered by the bottommost inter-dielectric layer 222. The numbers of the inter-dielectric layers 222 and of the patterned redistribution conductive layers 224 are not limited according to the disclosure.

In certain embodiments, the topmost patterned redistribution conductive layer 224 may include a plurality of pads. In such embodiments, the above-mentioned pads may include a plurality of under-ball metallurgy (UBM) patterns 224a for ball mount and/or a plurality of connection pads 224b for mounting of passive components. The numbers of the under-ball metallurgy patterns 224a and the number of the connection pads 224b are not limited according to the disclosure.

As shown in FIG. 4, in some embodiments, after the redistribution structure 220 is formed, a plurality of conductive balls 230 are placed on the under-ball metallurgy patterns 224a, and at least one passive component 240 is mounted on the connection pads 224b. The numbers of the conductive balls 230 and the passive component 240 are not limited according to the disclosure, and may be selected based on the demand. In some embodiments, the conductive balls 230 may be placed on the under-ball metallurgy patterns 224a through ball placement process, and the passive components 240 may be mounted on the connection pads 224b through soldering process. In some embodiments, through the redistribution structure 220 and the connection pads 224b, the passive component 240 is electrically connected to the integrated circuit component 200A. In some embodiments, through the redistribution structure 220 and the connection pads 224b, the passive component 240 is electrically connected to the conductive pillars CP. In some embodiments, through the redistribution structure 220 and the metallurgy patterns 224a, some of the conductive balls 230 are electrically connected to the integrated circuit component 200A. In some embodiments, through the redistribution structure 220 and the metallurgy patterns 224a, some of the conductive balls 230 are electrically connected to the passive component 240. In some embodiments, through the redistribution structure 220 and the metallurgy patterns 224a, some of the conductive balls 230 are electrically connected to the conductive pillars CP. In some embodiments, through the redistribution structure 220, the metallurgy patterns 224a and the conductive pillars CP, some of the conductive balls 230 are electrically connected to the redistribution structure 100. In certain embodiments, some of the conductive balls 230 may be electrically floated or grounded, the disclosure is not limited thereto. As shown in FIG. 4, for example, through the redistribution structure 220 and the conductive pillars CP, the integrated circuit component 200A is electrically connected to the redistribution structure 100. For certain embodiments, through the redistribution structure 220, the conductive pillars CP, and the metallurgy patterns 224a/the connection pads 224b, the conductive balls 230/the passive component 240 may be electrically connected to the redistribution structure 100.

Figure 5:
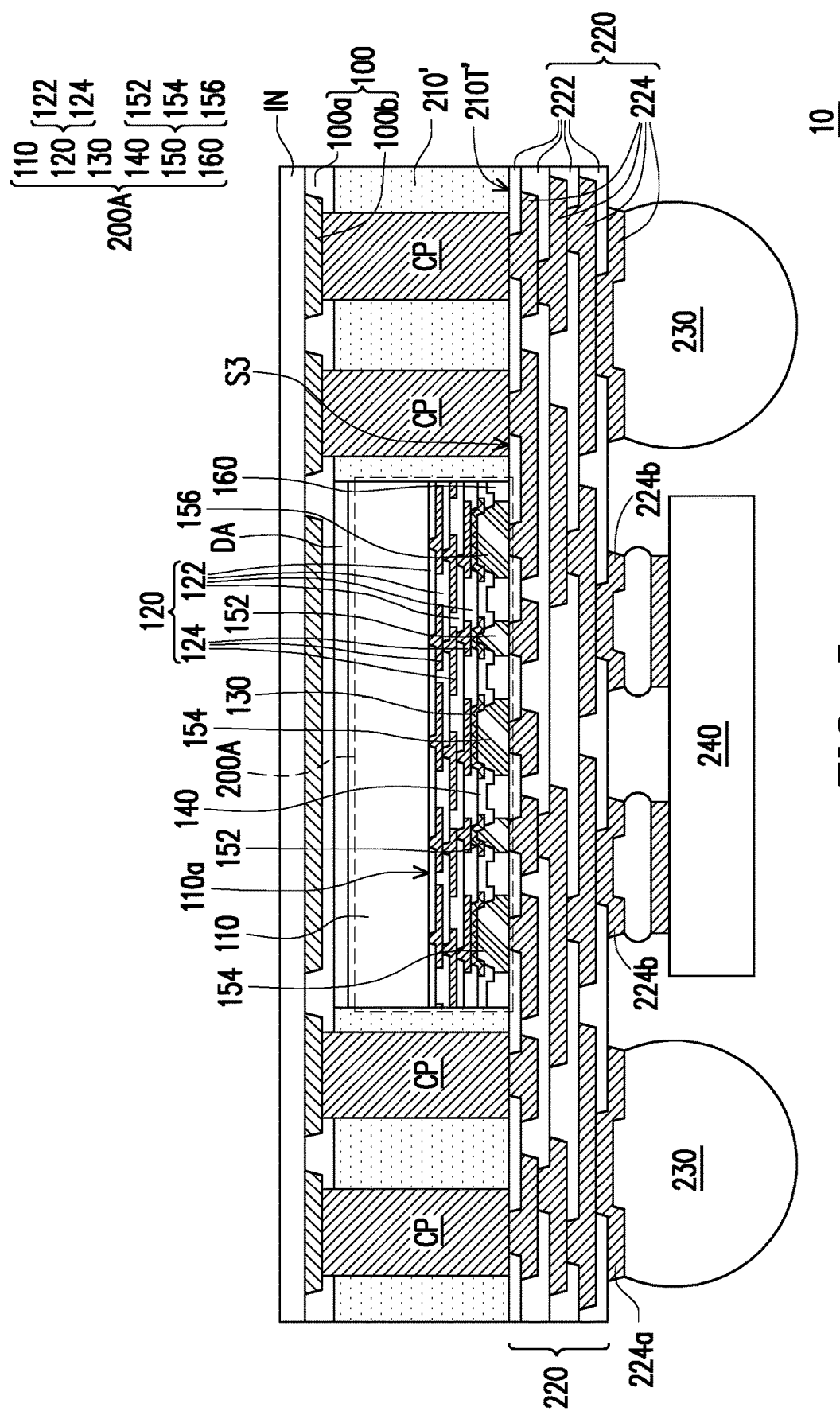

Referring to FIG. 4 and FIG. 5, in some embodiments, after the redistribution structure 220, the conductive balls 230 and the passive component 240 are formed, the insulating layer IN is de-bonded from the de-bonding layer DB carried by the carrier C, such that the insulating layer IN is separated from the carrier C. In embodiments where the de-bonding layer DB is the LTHC release layer, an UV laser irradiation may be utilized to facilitate peeling of the insulating layer IN from the carrier C. In certain embodiments, the insulating layer IN is exposed, as show in FIG. 5. In an alternative embodiment, the insulating layer IN may be removed from the redistribution structure 100 after debonding the carrier C and the de-bonding layer DB; the disclosure is not limited thereto.

In some embodiments, prior to debonding the de-bonding layer DB and the carrier C, the whole package structure 10 along with the carrier C may be flipped (turned upside down), where the conductive balls 230 and the passive component 240 are placed to a holding device (not shown) for securing the package structures 10 before debonding the carrier C and the de-bonding layer DB, and the carrier C is then debonded from the insulating layer IN. In some embodiments, the holding device may include a polymer film, and the conductive balls 230 and the passive component 240 are mounted into the polymer film. For example, the material of the polymer film may include a polymer film having sufficient elasticity to allow the conductive balls 230 and the passive component 240 being embedded therein. In certain embodiments, the holding device may be a parafilm or a film made of other suitable soft polymer materials or the like. In an alternative embodiment, the holding device may be an adhesive tape, a carrier film or a suction pad. The disclosure is not limited thereto.

Figure 6:
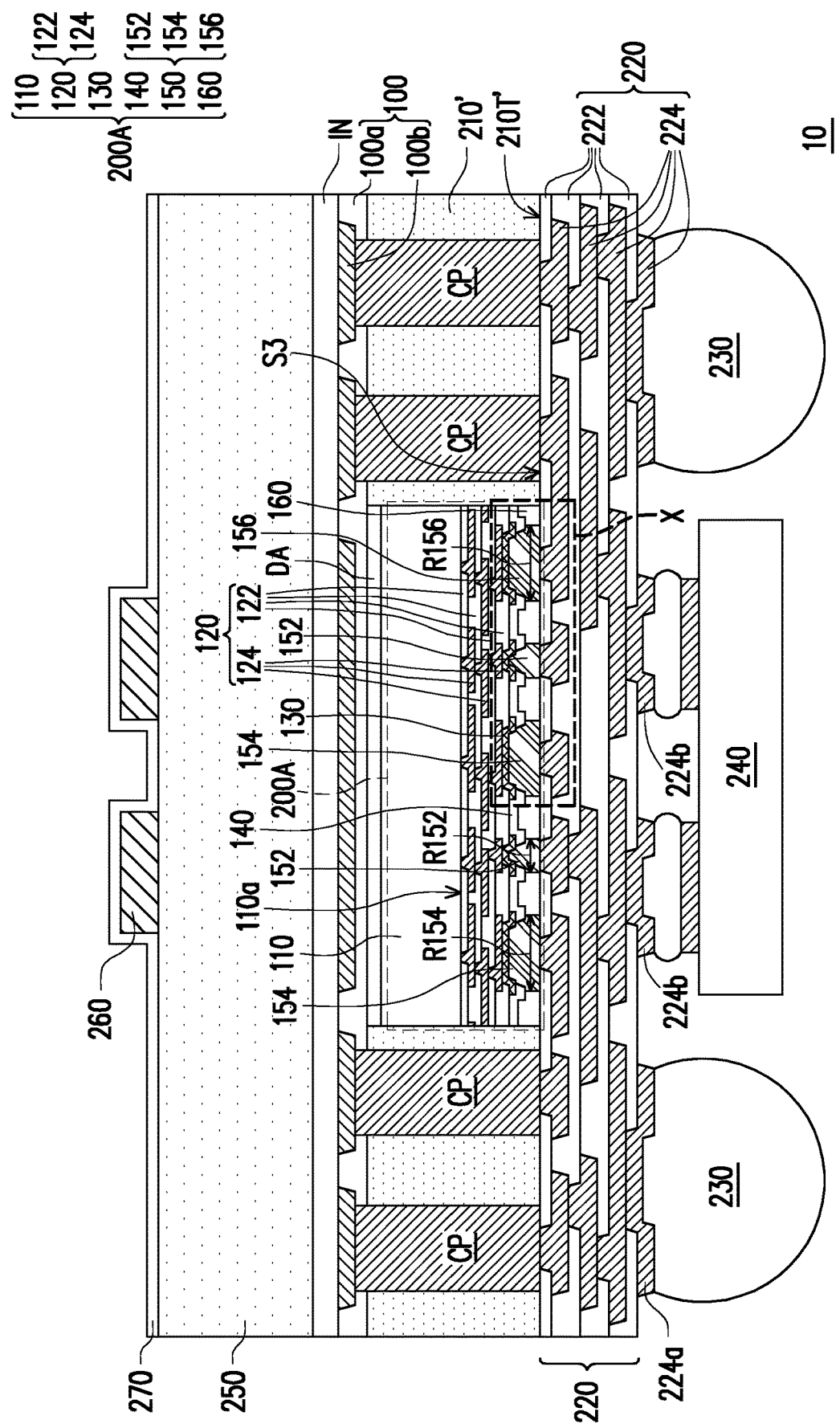
Figure 7:
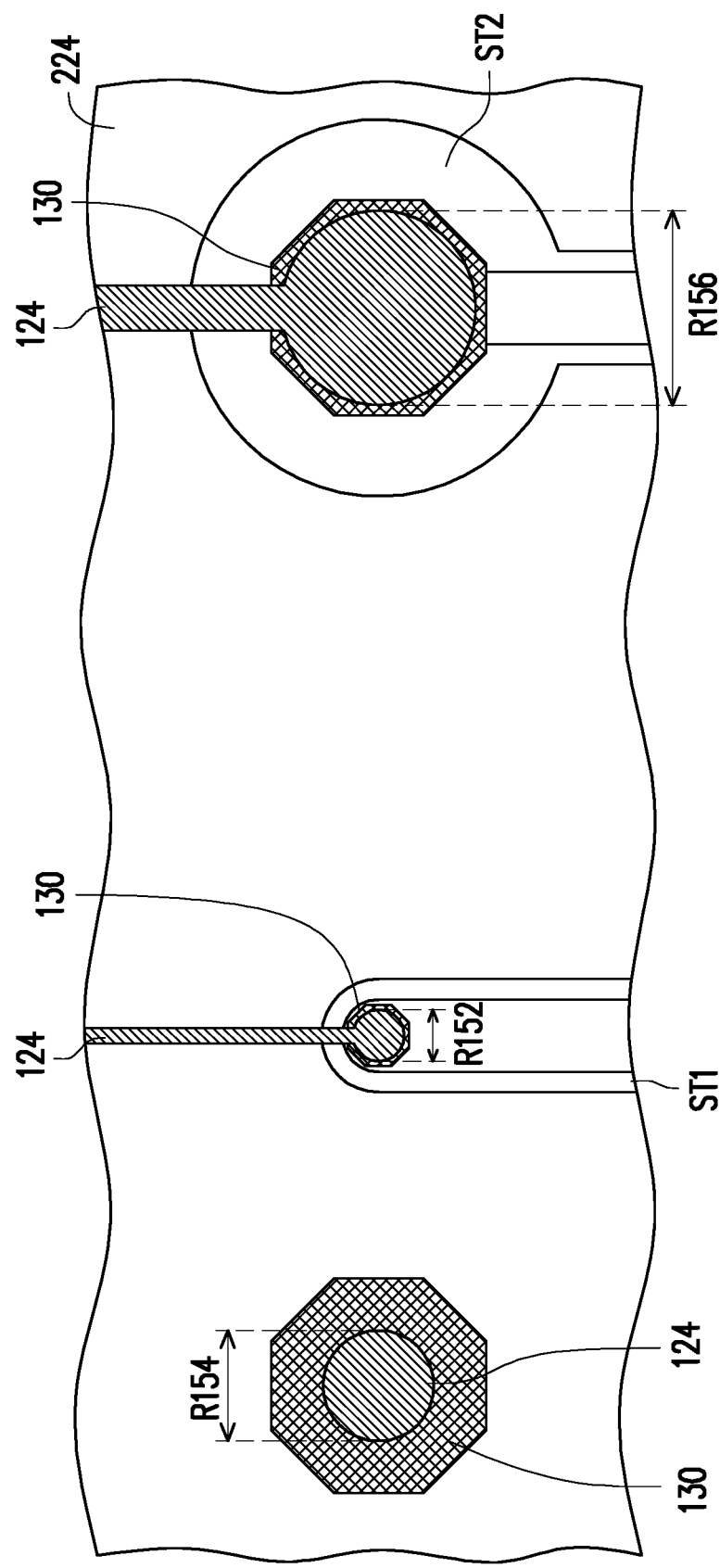
FIG. 7 is a schematic bottom view illustrating a relative position between a metallization layer of an interconnection structure, connecting pads, connecting vias, and a metallization layer of a redistribution structure of a package structure in accordance with some exemplary embodiments of the present disclosure.

Referring to FIG. 6, in some embodiments, an encapsulant 250 is formed on the insulating layer IN and over the redistribution structure 100 (e.g. the metallization layer 100b), where the encapsulant 250 covers the insulating layer IN. In some embodiments, the insulating layer IN is sandwiched between the encapsulant 250 and the redistribution structure 100. As shown in FIG. 6, the encapsulant 250 is formed on a surface of the insulating layer IN facing away from the redistribution structure 100. In some embodiments, prior to forming the encapsulant 250, the conducive balls 230 may be, for example, transferred to a temporary carrier (not shown, such as a tape, etc.) or a holding device as mentioned above for steadily holding the conductive balls 230 to avoid any damages to the conductive elements due to subsequent process(s). In some embodiments, the encapsulant 250 includes, for example, epoxy resins or any other suitable type of molding materials, where the material of the encapsulant 250 has low permittivity (Dk) and low loss tangent (Df) properties. Depending on the frequency range of the high-speed applications, suitable materials of the encapsulant may be selected based on the required electrical properties of the package.

In some embodiments, the materials of the encapsulant 250 and the insulating encapsulation 210' have low permittivity (Dk) and low loss tangent (Df) properties. With such condition, the material of the encapsulant 250 may be different from the material of the insulating encapsulation 210', the disclosure is not limited thereto. In an alternative embodiment, the material of the encapsulant 250 may be the same as the material of the insulating encapsulation 210'.

In some embodiments, as shown in FIG. 6, antenna elements 260 are formed on formed on the encapsulant 250, and over the insulating layer IN and the metallization layer 100b of the redistribution structure 100. The encapsulant 250 is located between the antenna elements 260 and the insulating layer IN. As shown in FIG. 6, the antenna elements 260 are formed on a surface of the encapsulant 250 facing away from the redistribution structure 100. In some embodiments, the antenna elements 260 are electrically coupled with the metallization layer 100b of the redistribution structure 100, where the metallization layer 100b of the redistribution structure 100 overlapped with the antenna elements 260 serves as a ground plate and a feed-line for the antenna elements 260. Due to the use of the material having the low permittivity (Dk) and low loss tangent (Df) properties for forming the encapsulant 250, higher gain of the antenna elements 260 is obtained. As shown in FIG. 6, the antenna elements 260 are electrically communicated with the integrated circuit component 200A through the redistribution structure 100.

In some embodiments, the antenna elements 260 are formed by forming a metallization layer (not shown) by electroplating or deposition over the encapsulant 250 and then patterning the metallization layer by photolithographic and etching processes. In an alternative embodiment, the antenna elements 260 are formed by forming a metallization layer (not shown) by plating process. In some embodiments, the material of the first metallization layer includes aluminum, titanium, copper, nickel, tungsten, and/or alloys thereof. In some embodiments, the antenna elements 260 are arranged in form of a matrix, such as the N×N array or N×M arrays (N, M>0, N may or may not be equal to M). In some embodiment, the antenna elements 260 may include patch antennas. For example, the package structure 10 includes the antenna elements 260 arranged in form of an array, such as a 2×2 array, however, the disclosure is not limited thereto. The size of the array for antenna elements 260 may be designated and selected based on the demand.

Continued on FIG. 6, in some embodiments, a protection layer 270 is formed over the antenna elements 260 and the encapsulant 250. As shown in FIG. 6, the protection layer 270 covers the antenna elements 260 and the exposed portions of the encapsulant 250, for example. In some embodiments, the material of the protection layer 270 may include polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be formed by suitable fabrication techniques such as deposition, spin-on coating, chemical vapor deposition (CVD), plasma-enhanced chemical vapor deposition (PECVD) or the like. The disclosure is not limited thereto. In one embodiment, the materials of the protection layer 270, the dielectric layer IN, the inter-dielectric layer 222 and/or the polymer dielectric layers 100a may be the same. In an alternative embodiment, the material of the protection layer 270 may be different from the materials of the dielectric layer IN, the inter-dielectric layer 222 and/or the polymer dielectric layers 100a.

In an alternative embodiment, the package structure 10 may further include one or more end-fire radiation antennas (not shown), and each of the end-fire radiation antennas is constituted by two of the conductive pillars CP and located aside of the integrated circuit component 200A along edges of the package structure 10. In one embodiment, for the two the conductive pillars CP in each end-fire radiation antenna, one conductive pillar CP is electrically connected to a part of the redistribution structure 100 or a part of the redistribution structure 220 (one of which serves as a feed line of the end-fire radiation antenna); and the other conductive pillar CP, which is electrically connected to the other one of a part of the redistribution structure 100 or a part of the redistribution structure 220 and is electrically grounded, serves as a ground plate/line of the end-fire radiation antenna. For example, the end-fire radiation antennas may be a dipole antennas with horizontal polarization or vertical polarization, the disclosure is not limited thereto.

In some embodiments, a dicing process is performed to cut the wafer having a plurality of package structures 10 into individual and separated package structures 10. In one embodiment, the dicing process is a wafer dicing process including mechanical blade sawing or laser cutting. Up to here, the manufacture of the package structure 10 is completed.

In an alternative embodiment, an additional package (not shown) may be provided. In certain embodiments, the additional package may be stacked over and electrically connected to the integrated circuit component 200A depicted in FIG. 6 through the conductive balls 230, such that a package-on-package (POP) structure is fabricated. However, the disclosure is not limited thereto. In another alternative embodiment, a semiconductor circuit board (not shown) may be provided and electrically connected to the integrated circuit component 200A depicted in FIG. 6 through the conductive balls 230, where the semiconductor circuit board may be a printed circuit board.

Referring to FIG. 6 and FIG. 7 together, in certain embodiments, one signal connecting via 152 and a respective one contact pad 130 immediately there-below and connecting thereto are together referred as a signal terminal of the integrated circuit component 200A for electrically connecting the integrated circuit component 200A and other components included in the package structure 10 (for example, for an electrical connection between two integrated circuit components, between an integrated circuit component and a redistribution structure, etc.), where the respective one contact pad 130 is referred as a signal contact pad. As shown in FIG. 6, the signal terminals each including one signal connecting via 152 and the respective contact pad 130 are electrically connected to the interconnection structure 120 by physically contacting the top surface of the topmost layer of the patterned conductive layers 124 exposed by the topmost layer of the inter-dielectric layers 122, for example. However, the disclosure is not limited thereto; and in an alternative embodiment, the signal terminals may exclude the respective contact pad 130. In one embodiment, some of the signal terminals may include the respective contact pad 130, and rest of the signal terminals may exclude the respective contact pad 130.

In some embodiments, one ground connecting vias 154 and a respective one contact pad 130 immediately there-below and connecting thereto are together referred as a ground terminal of the integrated circuit component 200A for electrically grounding the integrated circuit component 200A (for example, for an electrical connection between an integrated circuit component and an external component being electrically grounded), where the respective one contact pad 130 is referred as a ground contact pad. As shown in FIG. 6, the ground terminals each including one ground pillars 154 and the respective contact pad 130 are electrically connected to the interconnection structure 120 by physically contacting the top surface of the topmost layer of the patterned conductive layers 124 exposed by the topmost layer of the inter-dielectric layers 122, for example. However, the disclosure is not limited thereto; and in an alternative embodiment, the ground terminals may exclude the respective contact pad 130. In one embodiment, some of the ground terminals may include the respective contact pad 130, and rest of the ground terminals may exclude the respective contact pad 130.

In some embodiments, one power connecting via 156 and a respective one contact pad 130 immediately there-below and connecting thereto are together referred as a power terminal of the integrated circuit component 200A for electrical connecting the integrated circuit component 200A to a power source (for example, for an electrical connection between an integrated circuit component and an external component providing an electric power), where the respective one contact pad 130 is referred as a power contact pad. As shown in FIG. 6, the power terminal including one power connecting via 156 and the respective contact pad 130 is electrically connected to the interconnection structure 120 by physically contacting the top surface of the topmost layer of the patterned conductive layers 124 exposed by the topmost layer of the inter-dielectric layers 122, for example. However, the disclosure is not limited thereto; and in an alternative embodiment, the power terminal(s) may exclude the respective contact pad 130. In one embodiment, some of the power terminals may include the respective contact pad 130, and rest of the power terminals may exclude the respective contact pad 130.

There are only two signal terminals, two ground terminals and one power terminal illustrated in FIG. 1 to FIG. 6; however, the disclosure is not limited thereto. The numbers of the signal terminals, the ground terminals, and the power terminals are not limited to the disclosure, and may be selected and designated based on the demand and the design layout. In the disclosure, in some embodiments, the ground terminals are also considered as a type of the power terminal.

In some embodiments, as shown in FIG. 6 and FIG. 7, a size R152 of the signal connecting vias 152 is less than a size R156 of the power connecting via 156, the size R152 of the signal connecting vias 152 is less than the size R154 of the ground connecting vias 154, and the size R154 of the ground connecting vias 154 is substantially equal to a size R156 of the power connecting via 156, however the disclosure is not limited thereto. In one embodiment, the size R152 of the signal connecting vias 152 is less than the size R156 of the power connecting via 156, the size R152 of the signal connecting vias 152 is substantially equal to the size R154 of the ground connecting vias 154, and the size R154 of the ground connecting vias 154 is less than to the size R156 of the power connecting via 156. In an alternative embodiment, the size R152 of the signal connecting vias 152 is less than the size R156 of the power connecting via 156, the size R152 of the signal connecting vias 152 is less than the size R154 of the ground connecting vias 154, and the size R154 of the ground connecting vias 154 is less than a size R156 of the power connecting via 156.

Due to the size differences between the signal connecting vias 152, the ground connecting vias 154, and the power connecting via 156, the contact pads 130 corresponding to the signal connecting vias 152, the ground connecting vias 154, and the power connecting via 156 also have different sizes. In one embodiment, as shown in FIG. 7, a size of the contact pads 130 corresponding to the signal connecting vias 152 is less than a size of the contact pads 130 corresponding to the power connecting via 156, the size of the contact pads 130 corresponding to the signal connecting vias 152 is less than a size of the contact pads 130 corresponding to the ground connecting vias 154, and the size of the contact pads 130 corresponding to the ground connecting vias 154 is less than or substantially equal to the size of the contact pads 130 corresponding to the power connecting via 156. In an alternative embodiment, the size of the contact pads 130 corresponding to the signal connecting vias 152 is less than the size of the contact pads 130 corresponding to the power connecting via 156, the size of the contact pads 130 corresponding to the signal connecting vias 152 is less than or substantially equal to the size of the contact pads 130 corresponding to the ground connecting vias 154, and the size of the contact pads 130 corresponding to the ground connecting vias 154 is less than the size of the contact pads 130 corresponding to the power connecting via 156.

In certain embodiments, similarly, due to the size differences between the signal connecting vias 152, the ground connecting vias 154, and the power connecting via 156, a size of the exposed top surface of the topmost layer of the patterned conductive layers 124 corresponding to the contact pads 130 respectively and immediately underlying the signal connecting vias 152, the ground connecting vias 154, and the power connecting via 156 also have different sizes, which has a size relationship there-between similar to the respective contact pads 130 and thus is not repeated herein. Due to the above configuration, the power loss and/or the reflected power of the package structure 10 are reduced, thereby protecting active circuits of the package structure 10 and achieving a low power consumption. In addition, due to the size R152 of the signal connecting vias 152 is less than the size R156 of the power connecting via 156, an overall area of the package structure 10 is reduced.

Additionally, as shown in FIG. 6 and FIG. 7, portions of the bottommost layer of the patterned redistribution conductive layers 224 exposed by the bottommost layer of the inter-dielectric layer 222 are respectively mechanically and electrically connected to the top surfaces of the signal terminals (e.g. the top surfaces of the signal connecting vias 152) and the top surfaces of the power terminal (e.g. the top surfaces of the power connecting via 156), which serve as conductive lines for signal transmission or for power supply to the integrated circuit component 200A, while other portions of the bottommost layer of the patterned redistribution conductive layers 224 exposed by the bottommost layer of the inter-dielectric layer 222 are mechanically and electrically connected to the top surfaces of the ground terminals (e.g. the top surfaces of the ground connecting vias 154), which serve as the ground plate for the integrated circuit component 200A. As shown in FIG. 7, in some embodiments, the portions of the bottommost layer of the patterned redistribution conductive layers 224 connecting to the signal terminals is separated from the other portions of the bottommost layer of the patterned redistribution conductive layers 224 connecting to the ground terminal by a slit ST1. In one embodiment, the slit ST1 may include a constant width. In an alternative embodiment, the slit ST1 may include a non-constant width. In certain embodiments, the portions of the bottommost layer of the patterned redistribution conductive layers 224 connecting to the power terminal is separated from the other portions of the bottommost layer of the patterned redistribution conductive layers 224 connecting to the ground terminal by a slit ST2. In one embodiment, the slit ST2 may include a constant width. In an alternative embodiment, the slit ST2 may include a non-constant width. With such slits ST1 and ST2, short circuit occurred in operating the package structure 10 is further prevented.

Figure 8:
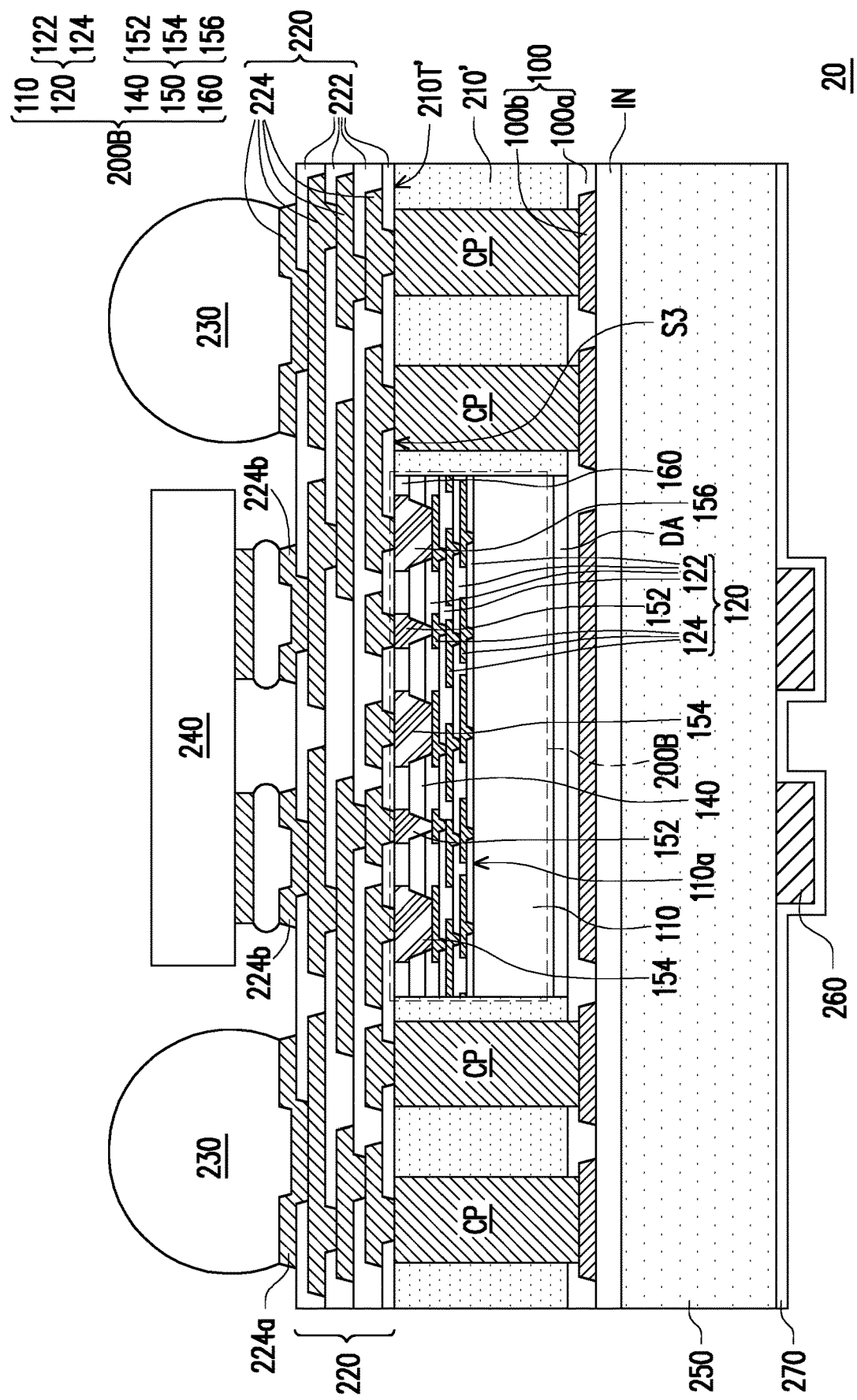
FIG. 8 is a schematic cross sectional view illustrating a package structure in accordance with some exemplary embodiments of the present disclosure.

FIG. 8 is a schematic cross sectional view illustrating a package structure in accordance with some exemplary embodiments of the present disclosure. Referring to FIG. 6 and FIG. 8 together, the package structure 10 depicted in FIG. 6 and the package structure 20 depicted in FIG. 8 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 6 and FIG. 8 together, the difference is that, for the package structure 20 depicted in FIG. 8, the package structure 20 includes an integrated circuit component 200B, where the contact pads 130 are omitted. As shown in FIG. 8, the signal connecting vias 152, the ground connecting vias 154, and the power connecting via 156 are electrically connected to the topmost layer of different and separated portions of the patterned conductive layers 124 exposed by the topmost layer of the inter-dielectric layers 122 by direct contact (e.g. mechanical or physical contact). That is, for example, each of the signal terminals include one signal connecting via 152 without the presence of the signal contact pad, each of the ground terminals include one ground connecting via 154 without the presence of the ground contact pad, and the power terminals include one power connecting via 156 without the presence of the power contact pad. With such configuration, the total manufacture cost is reduced.

Figure 9:
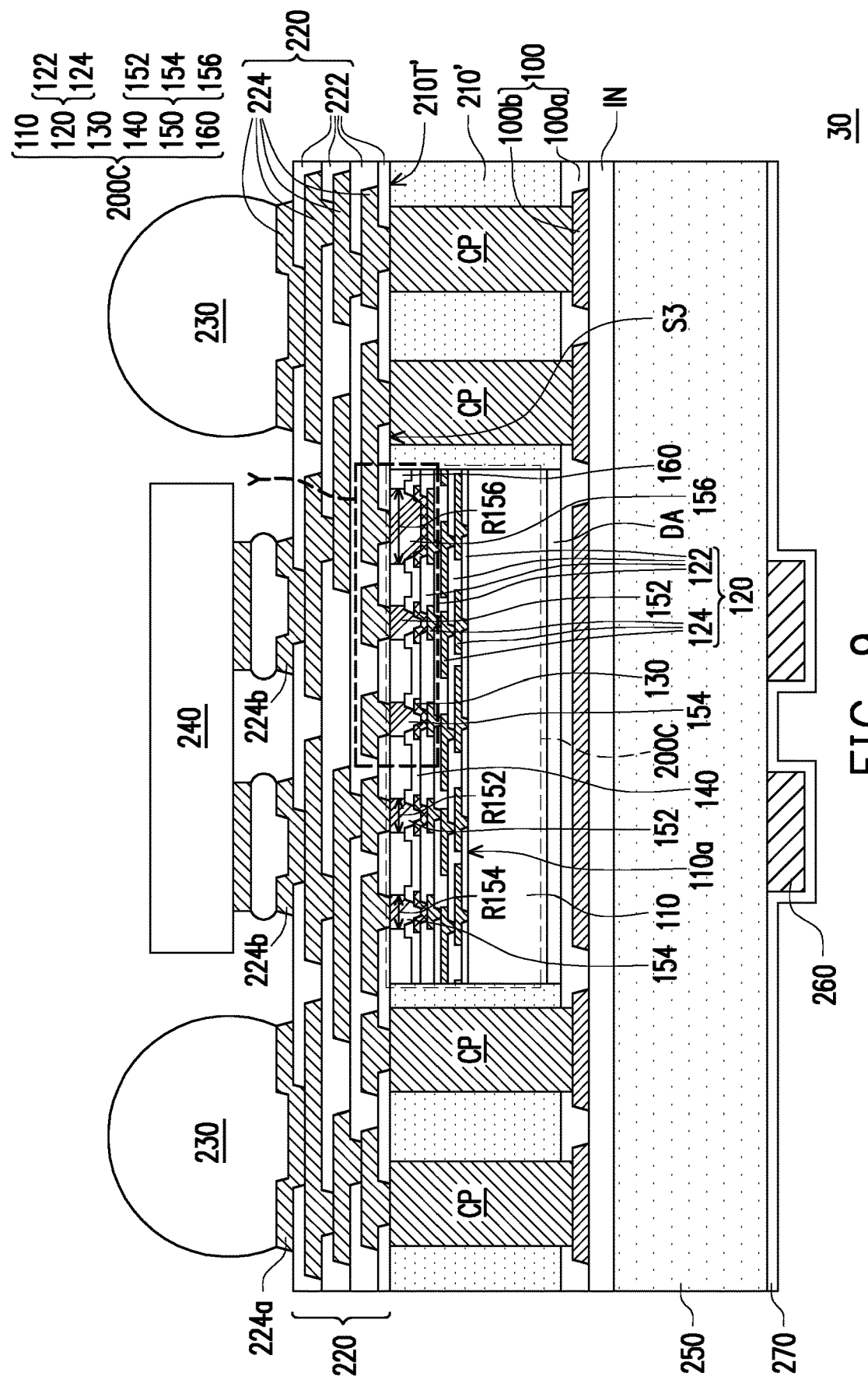
FIG. 9 is a schematic cross sectional view illustrating a package structure in accordance with some exemplary embodiments of the present disclosure.
Figure 10:
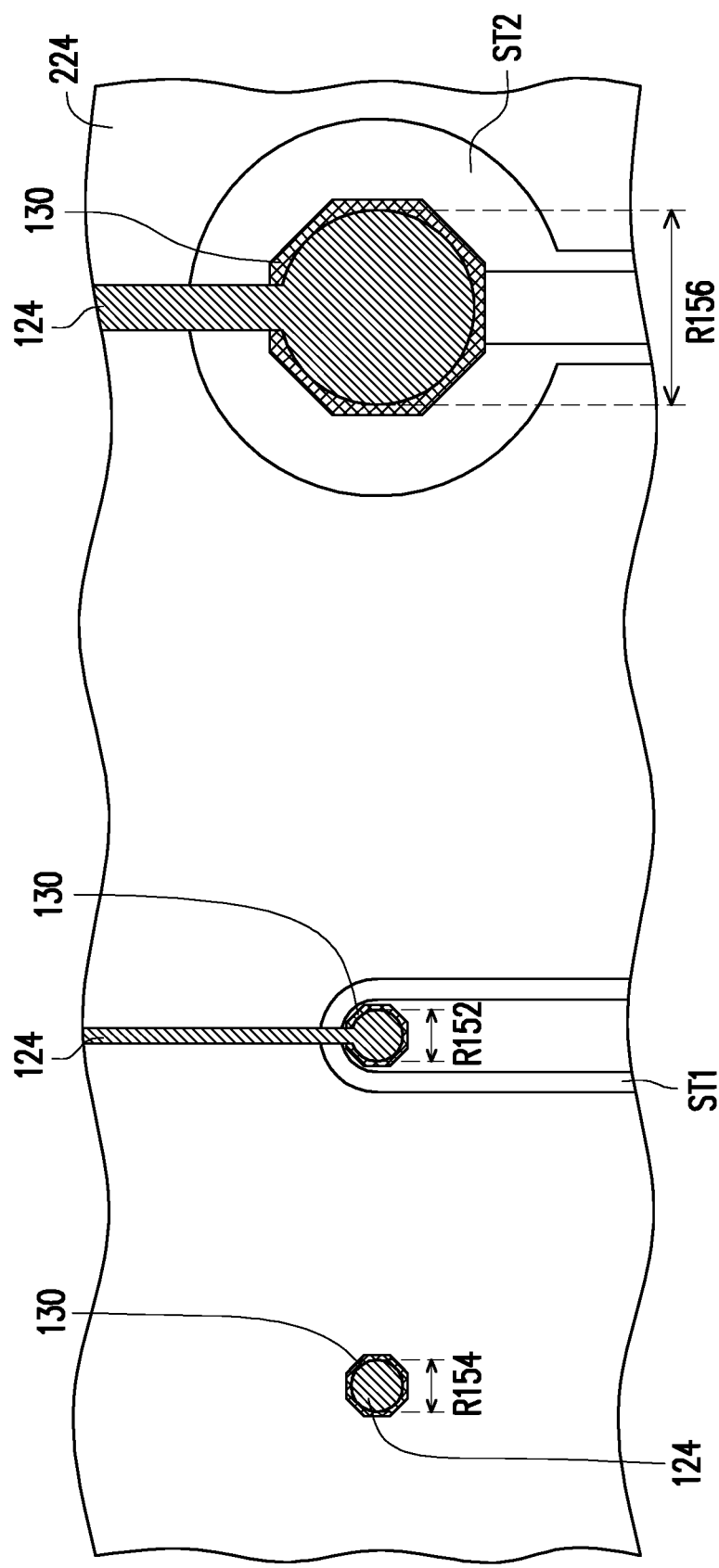
FIG. 10 is a schematic bottom view illustrating a relative position between a metallization layer of an interconnection structure, connecting pads, connecting vias, and a metallization layer of a redistribution structure of a package structure in accordance with some exemplary embodiments of the present disclosure.

FIG. 9 is a schematic cross sectional view illustrating a package structure in accordance with some exemplary embodiments of the present disclosure. FIG. 10 is a schematic bottom view illustrating a relative position between a metallization layer of an interconnection structure, connecting pads, connecting vias, and a metallization layer of a redistribution structure of a package structure in accordance with some exemplary embodiments of the present disclosure, where FIG. 10 is an enlarged schematic bottom view showing the positioning configuration of an interconnection structure (e.g. a topmost metallization layer), connecting pads, connecting vias, and a redistribution structure (e.g. a bottommost metallization layer) of the package structure 30 depicted in FIG. 9 (indicated by a dotted box Y). Referring to FIG. 6 and FIG. 9 together, the package structure 10 depicted in FIG. 6 and the package structure 30 depicted in FIG. 9 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 6 and FIG. 9 together, the difference is that, for the package structure 30 depicted in FIG. 9, the package structure 30 includes an integrated circuit component 200C, where the size R152 of the signal connecting vias 152 is less than the size R156 of the power connecting via 156, the size R152 of the signal connecting vias 152 is substantially equal to the size R154 of the ground connecting vias 154, and the size R154 of the ground connecting vias 154 is less than to the size R156 of the power connecting via 156. With such configuration, the package structure 30 achieves better impedance match and lower power loss.

Figure 11:
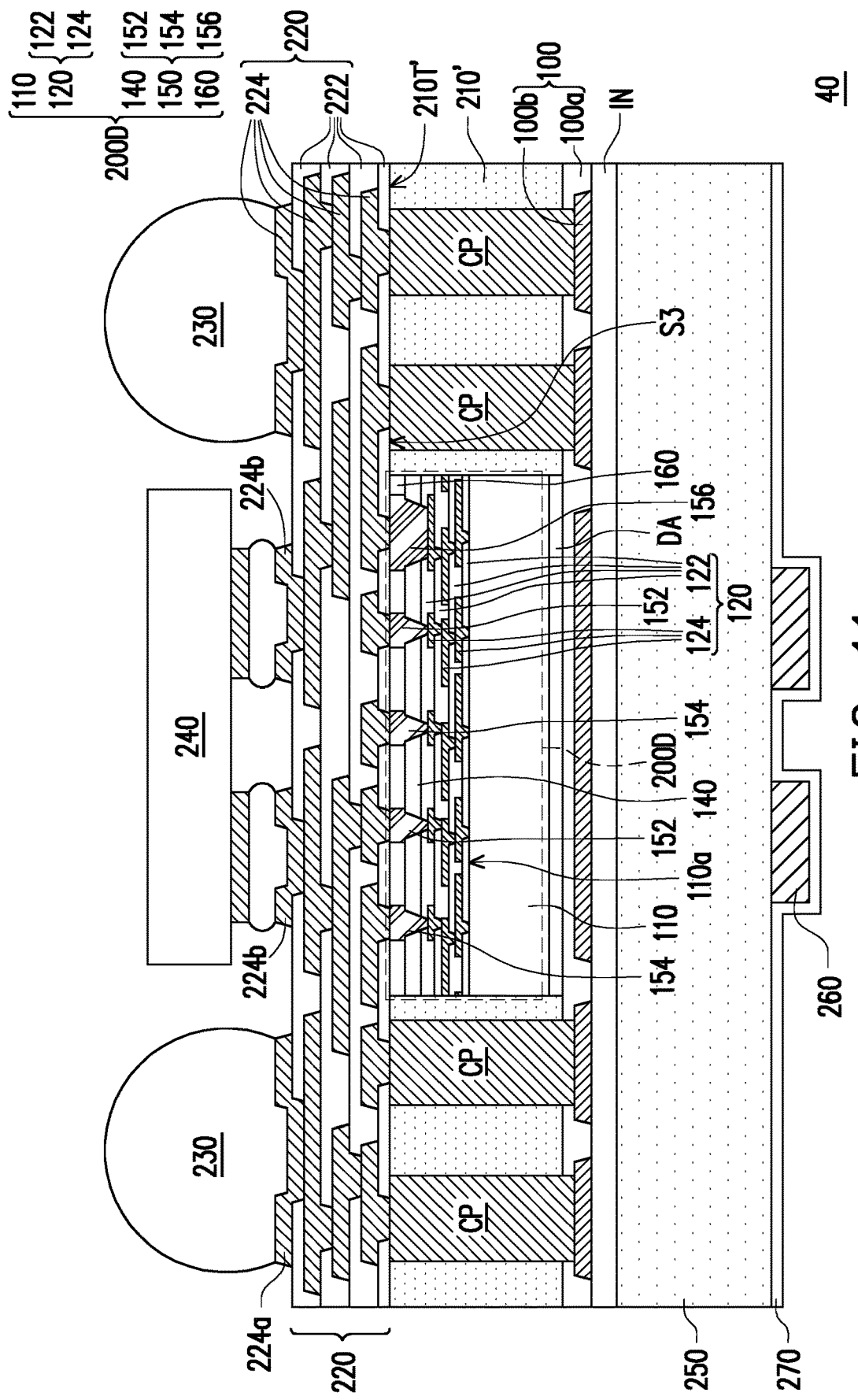
FIG. 11 is a schematic cross sectional view illustrating a package structure in accordance with some exemplary embodiments of the present disclosure.

FIG. 11 is a schematic cross sectional view illustrating a package structure in accordance with some exemplary embodiments of the present disclosure. Referring to FIG. 9 and FIG. 11 together, the package structure 30 depicted in FIG. 9 and the package structure 40 depicted in FIG. 11 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 9 and FIG. 11 together, the difference is that, for the package structure 40 depicted in FIG. 11, the package structure 40 includes an integrated circuit component 200D, where the contact pads 130 are omitted. As shown in FIG. 11, the signal connecting vias 152, the ground connecting vias 154 and the power connecting via 156 are electrically connected to the topmost layer of the patterned conductive layers 124 exposed by the topmost layer of the inter-dielectric layers 122 by direct contact (e.g. mechanical or physical contact). That is, for example, each of the signal terminals include one signal connecting via 152 without the presence of the signal contact pad, each of the ground terminals include one ground connecting via 154 without the presence of the ground contact pad, and the power terminals include one power connecting via 156 without the presence of the power contact pad. With such configuration, the total manufacture cost is reduced.

Figure 12:
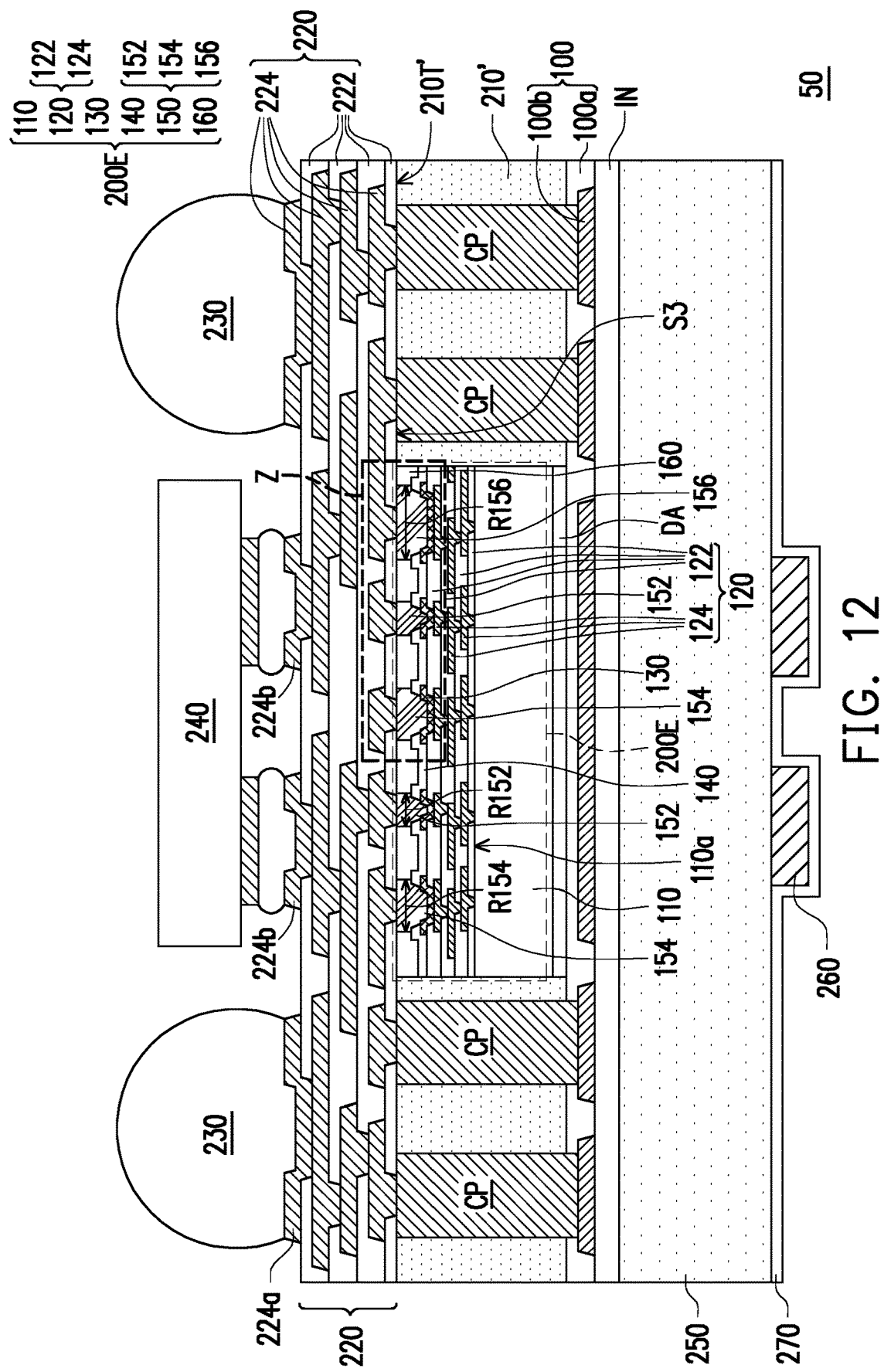
FIG. 12 is a schematic cross sectional view illustrating a package structure in accordance with some exemplary embodiments of the present disclosure.
Figure 13:
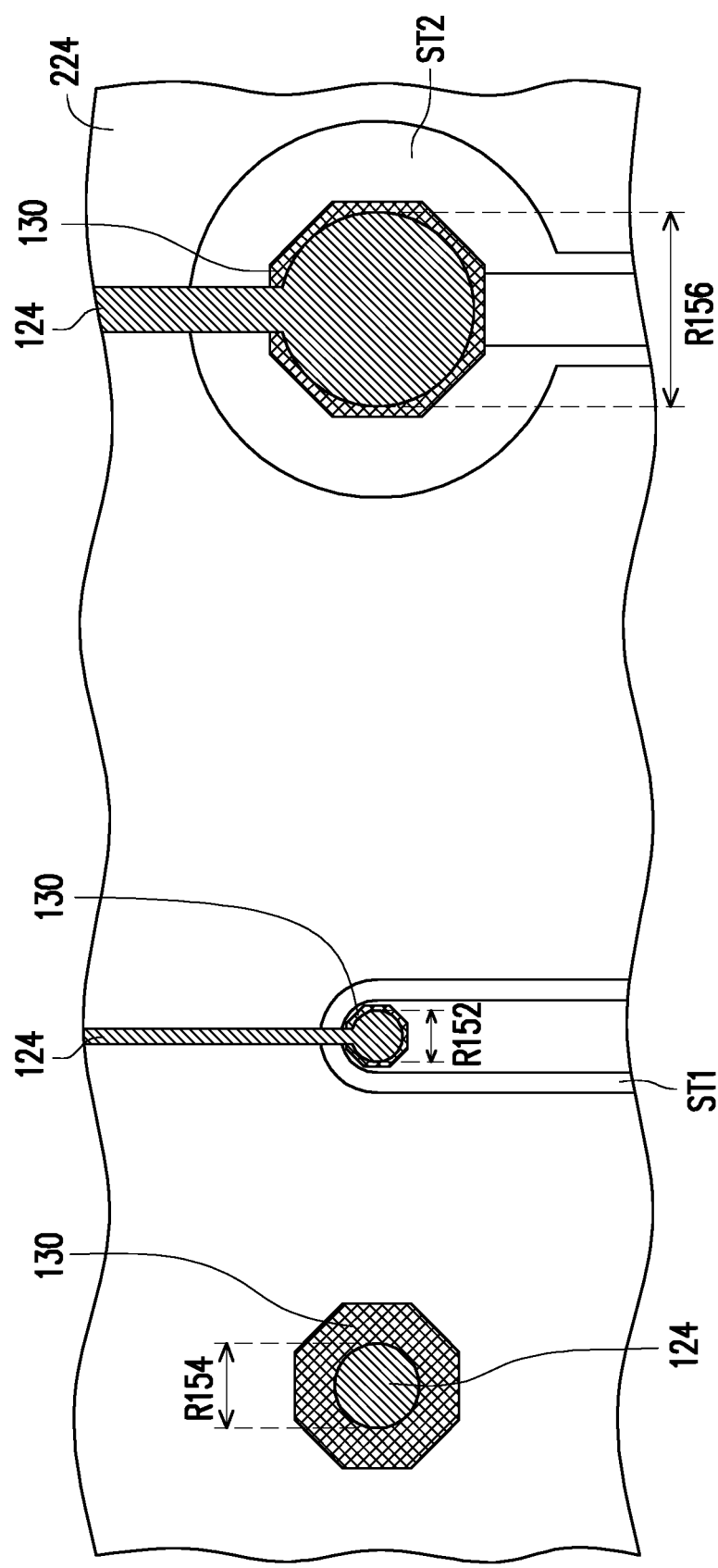
FIG. 13 is a schematic bottom view illustrating a relative position between a metallization layer of an interconnection structure, connecting pads, connecting vias, and a metallization layer of a redistribution structure of a package structure in accordance with some exemplary embodiments of the present disclosure.

FIG. 12 is a schematic cross sectional view illustrating a package structure in accordance with some exemplary embodiments of the present disclosure. FIG. 13 is a schematic bottom view illustrating a relative position between a metallization layer of an interconnection structure, connecting pads, connecting vias, and a metallization layer of a redistribution structure of a package structure in accordance with some exemplary embodiments of the present disclosure, where FIG. 13 is an enlarged schematic bottom view showing the positioning configuration of an interconnection structure (e.g. a topmost metallization layer), connecting pads, connecting vias, and a redistribution structure (e.g. a bottommost metallization layer) of the package structure 50 depicted in FIG. 12 (indicated by a dotted box Z). Referring to FIG. 6 and FIG. 12 together, the package structure 10 depicted in FIG. 6 and the package structure 50 depicted in FIG. 12 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 6 and FIG. 12 together, the difference is that, for the package structure 50 depicted in FIG. 12, the package structure 50 includes an integrated circuit component 200E, where the size R152 of the signal connecting vias 152 is less than the size R156 of the power connecting via 156, the size R152 of the signal connecting vias 152 is less than the size R154 of the ground connecting vias 154, and the size R154 of the ground connecting vias 154 is less than a size R156 of the power connecting via 156.

Figure 14:
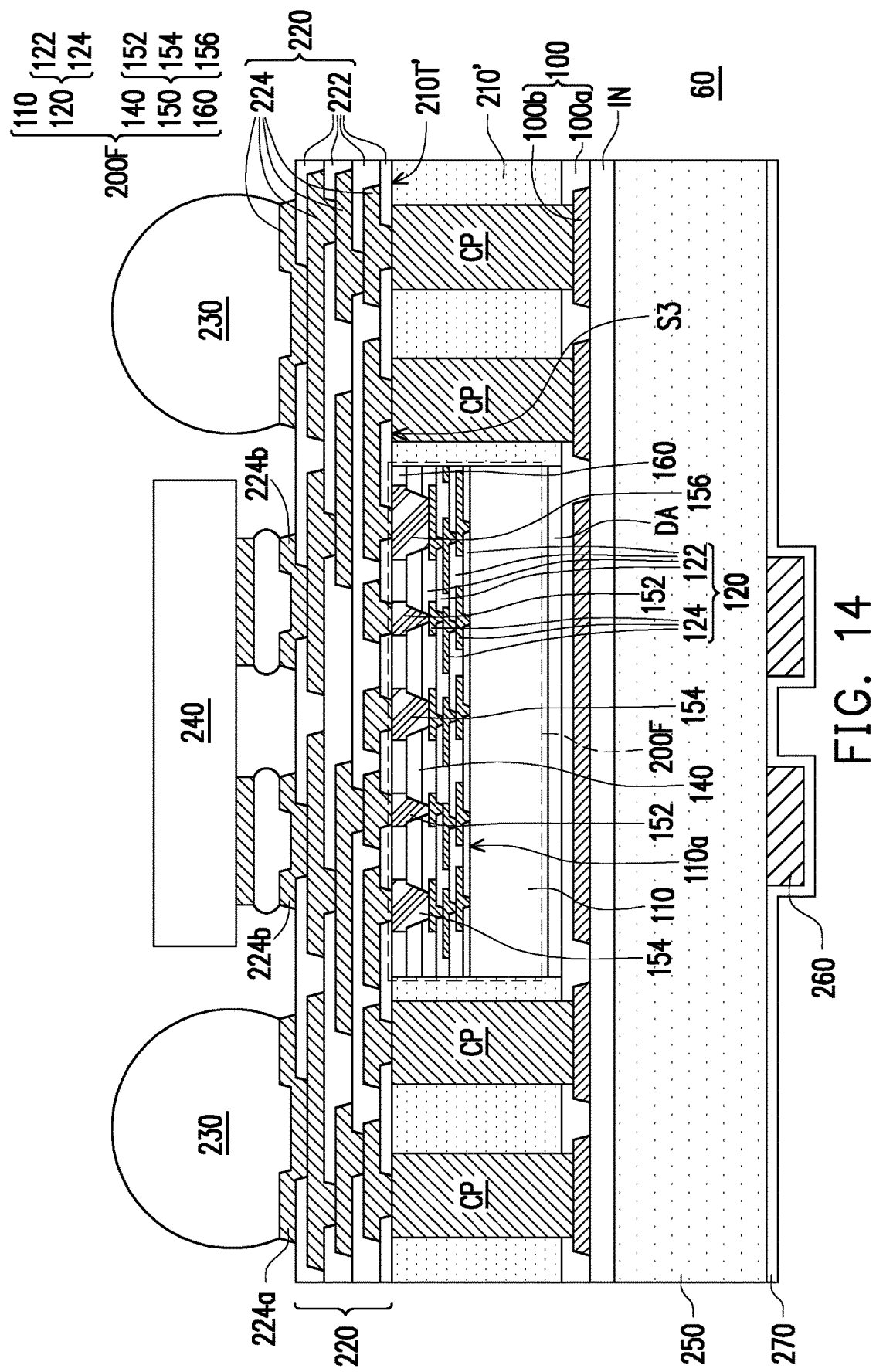
FIG. 14 is a schematic cross sectional view illustrating a package structure in accordance with some exemplary embodiments of the present disclosure.

FIG. 14 is a schematic cross sectional view illustrating a package structure in accordance with some exemplary embodiments of the present disclosure. Referring to FIG. 12 and FIG. 14 together, the package structure 50 depicted in FIG. 12 and the package structure 60 depicted in FIG. 14 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 12 and FIG. 14 together, the difference is that, for the package structure 60 depicted in FIG. 14, the package structure 60 includes an integrated circuit component 200F, where the contact pads 130 are omitted. As shown in FIG. 14, the signal connecting vias 152, the ground connecting vias 154 and the power connecting via 156 are electrically connected to the topmost layer of the patterned conductive layers 124 exposed by the topmost layer of the inter-dielectric layers 122 by direct contact (e.g. mechanical or physical contact). That is, for example, each of the signal terminals include one signal connecting via 152 without the presence of the signal contact pad, each of the ground terminals include one ground connecting via 154 without the presence of the ground contact pad, and the power terminals include one power connecting via 156 without the presence of the power contact pad. With such configuration, the total manufacture cost is reduced.

As shown in FIG. 14, in some embodiments, the active surface 110a of the integrated circuit component 200F is facing away from the antenna elements 260, where the redistribution structure 220 is referred to a front-side redistribution circuit structure of the integrated circuit component 200F and the redistribution structure 100 is referred to a back-side redistribution circuit structure of the integrated circuit component 200F. For example, the redistribution structure 220 is electrically connected to the integrated circuit component 200F by physically connecting to the signal connecting pillars 152, the ground connecting pillars 154 and the power connecting pillars 156 of the integrated circuit component 200F, while the redistribution structure 100 is electrically connected to the integrated circuit component 200F through the signal connecting pillars 152, the ground connecting pillars 154 and the power connecting pillars 156 of the integrated circuit component 200F, the redistribution structure 220, and the conductive pillars CP, as shown in FIG. 14. However, the disclosure is not limited thereto.

In an alternative embodiment, the active surface 110a of the integrated circuit component 200F is facing toward the antenna elements 260, where the redistribution structure 220 is referred to a back-side redistribution circuit structure of the integrated circuit component 200F and the redistribution structure 100 is referred to a front-side redistribution circuit structure of the integrated circuit component 200F. For example, the redistribution structure 220 is electrically connected to the integrated circuit component 200F through the conductive pillars CP, the redistribution structure 110, and the signal connecting pillars 152, the ground connecting pillars 154 and the power connecting pillars 156 of the integrated circuit component 200F, while the redistribution structure 100 is electrically connected to the integrated circuit component 200F by physically connecting to the signal connecting pillars 152, the ground connecting pillars 154 and the power connecting pillars 156 of the integrated circuit component 200F. In addition, such orientation of the integrated circuit component 200F may further apply to the aforementioned the integrated circuit components 200A~200E respectively formed in the package structures 10~50. In such embodiment, the connecting film DA may be omitted, the disclosure is not limited thereto.

In some embodiments, as depicted in FIG. 7, FIG. 10, and FIG. 13, the signal connecting pillars 152 and the power connecting pillars 156 are completely overlapped with the bottommost layer of the metallization layers 124 of the interconnection structure 120, and thus are not shown in FIG. 7, FIG. 10, and FIG. 13.

In accordance with some embodiments, a package structure includes at least one integrated circuit component, an insulating encapsulation, and a redistribution structure. The at least one integrated circuit component includes a semiconductor substrate, an interconnection structure disposed on the semiconductor substrate, and signal terminals and power terminals located on and electrically connecting to the interconnection structure. The interconnection structure is located between the semiconductor substrate and the signal terminals and between the semiconductor substrate and the power terminals, and wherein a size of the signal terminals is less than a size of the power terminals. The insulating encapsulation encapsulates the at least one integrated circuit component. The redistribution structure is located on the insulating encapsulation and electrically connected to the at least one integrated circuit component.

In accordance with some embodiments, a package structure includes at least one integrated circuit component, an insulating encapsulation, and a redistribution structure. The at least one integrated circuit component includes a semiconductor substrate, an interconnection structure disposed on the semiconductor substrate, signal terminals located on and electrically connecting to the interconnection structure, and power terminals located on and electrically connecting to the interconnection structure. A size of at least a portion of the power terminals is greater than a size of the signal terminals, and the interconnection structure is located between the semiconductor substrate and the signal terminals and between the semiconductor substrate and the power terminals. The insulating encapsulation encapsulates the at least one integrated circuit component. The redistribution structure is located on the insulating encapsulation and electrically connected to the at least one integrated circuit component.

In accordance with some embodiments, a package structure includes at least one integrated circuit component, an insulating encapsulation, and a redistribution structure. The at least one integrated circuit component includes a semiconductor substrate, an interconnection structure disposed on the semiconductor substrate, and signal connecting vias, ground connecting vias and at least one power connecting via s located on and electrically connecting to the interconnection structure. The interconnection structure is located between the semiconductor substrate and the signal connecting vias, between the semiconductor substrate and the ground connecting vias, and between the semiconductor substrate and the at least one power connecting via, wherein a first size of the signal connecting vias is less than a second size of the at least one power connecting via. The insulating encapsulation encapsulates the at least one integrated circuit component. The redistribution structure is located on the insulating encapsulation and electrically connected to the at least one integrated circuit component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor substrate, having an active surface;
   a first semiconductor device, located on the active surface of the semiconductor substrate;
   a first redistribution structure, located on the active surface of the semiconductor substrate and electrically connected to the first semiconductor device;
   conductive terminals, located over and electrically connected to the first redistribution structure, wherein the first redistribution structure is located between the semiconductor substrate and the conductive terminals;
   a second redistribution structure, located on and connected to the first redistribution structure, wherein the second redistribution structure is located between the first redistribution structure and the conductive terminals, wherein the first redistribution structure is located between the second redistribution structure and the semiconductor substrate; and
   a signal terminal and a power terminal, located on and electrically connected to the first redistribution structure, wherein a size of the signal terminal is less than a size of the power terminal, and the first redistribution structure is electrically connected to the second redistribution structure through the signal terminal and the power terminal.

2. The package structure of claim 1, wherein the first semiconductor device comprises an active device, a passive device or a combination thereof.

3. The package structure of claim 1, further comprising:
   wherein the first redistribution structure is located between the second redistribution structure and the first semiconductor device, and a sidewall of the first redistribution structure is aligned with a sidewall of the semiconductor substrate.

4. The package structure of claim 3, further comprising:
   an insulating encapsulation, encapsulating the semiconductor substrate and the first redistribution structure and located over the second redistribution structure, wherein the sidewall of the semiconductor substrate and the sidewall of the first redistribution structure are covered by the insulating encapsulation;
   a third redistribution structure, located over the insulating encapsulation, wherein the insulating encapsulation is located between the second redistribution structure and the third redistribution structure; and
   conductive pillars, located in and penetrating through the insulating encapsulation and adjacent to the semiconductor substructure, wherein the conductive pillars are located between and electrically connected to the second redistribution structure and the third redistribution structure,
wherein a sidewall of the third redistribution structure, a sidewall of the insulating encapsulation and a sidewall of the second redistribution structure are aligned with each other.

5. The package structure of claim 4, further comprising:
an encapsulant, located on the third redistribution structure, wherein the third redistribution structure is located between the insulating encapsulation and the encapsulant; and
antenna elements, located on the encapsulant, wherein the antenna element is electrically coupled to the third redistribution structure, and the encapsulant is located between the third redistribution structure and the antenna elements.

6. The package structure of claim 1, further comprising:
a ground terminal, located on and electrically connected to the first redistribution structure, wherein the first redistribution structure is further electrically connected to the second redistribution structure through the ground terminal, and
wherein:
a size of the ground terminal is less than the size the power terminal while the size of the ground terminal is greater than or substantially equal to the size the signal terminal, or
a size of the ground terminal is substantially equal to the size the power terminal while the size of the ground terminal is greater than the size the signal terminal.

7. The package structure of claim 3, wherein the first semiconductor device is located between a bottom surface of the semiconductor substrate and the first redistribution structure, and the bottom surface is opposite to the active surface along a stacking direction of the semiconductor substrate and the first redistribution structure, and the package structure further comprises:
a second semiconductor device, located on and electrically connected to the second redistribution structure, wherein the second redistribution structure is located between the second semiconductor device and the first semiconductor device along the stacking direction.

8. A package structure, comprising:
an integrated circuit component, comprising a semiconductor substrate;
a passive device, located on the semiconductor substrate of the integrated circuit component;
an insulating encapsulation, encapsulating the integrated circuit component; and
a first redistribution structure, located on the semiconductor substrate of the integrated circuit component and the insulating encapsulation, wherein the first redistribution structure is electrically coupled to the integrated circuit component and the passive device,
wherein the insulating encapsulation has a first surface and a second surface opposite to the first surface along a stacking direction of the integrated circuit component and the first redistribution structure,
wherein an active side of the integrated circuit component is substantially coplanar to the first surface of the insulating encapsulation, and a backside side of the integrated circuit component is embedded in the insulating encapsulation and located between the first surface and the second surface of the insulating encapsulation.

9. The package structure of claim 8, further comprising:
a second redistribution structure, located over the insulating encapsulation and the integrated circuit component, wherein the insulating encapsulation is located between the first redistribution structure and the second redistribution structure; and
conductive pillars, encapsulated in the insulating encapsulation and adjacent to the integrated circuit component, wherein the conductive pillars electrically connects the first redistribution structure and the second redistribution structure.

10. The package structure of claim 9, further comprising:
an encapsulant, located on the second redistribution structure, wherein the second redistribution structure is located between the insulating encapsulation and the encapsulant; and
antenna elements, located on the encapsulant, wherein the antenna element is electrically coupled to the second redistribution structure, and the encapsulant is located between the second redistribution structure and the antenna elements.

11. The package structure of claim 10, further comprising:
a protecting layer, covering the antenna elements, wherein the antenna elements are enclosed between the encapsulant and the protecting layer.

12. The package structure of claim 8, further comprising:
conductive terminals, located on and connected to the first redistribution structure, wherein the first redistribution structure is located between the insulating encapsulation and the conductive terminals.

13. The package structure of claim 8, wherein the integrated circuit component further comprises:
the semiconductor substrate;
an interconnection structure, located on the semiconductor substrate;
signal terminals, located on and electrically connecting to the interconnection structure; and
power terminals, located on and electrically connecting to the interconnection structure, wherein a size of each of at least a portion of the power terminals is greater than a size of each of the signal terminals, and a size of each of rest of the power terminals is substantially equal to the size of each of the signal terminals,
wherein the passive device is located between the interconnection structure and the semiconductor substrate, and the interconnection structure is located between the first redistribution structure and the semiconductor substrate.

14. The package structure of claim 8, wherein the integrated circuit component further comprises:
the semiconductor substrate;
an interconnection structure, located on the semiconductor substrate;
signal terminals, located on and electrically connecting to the interconnection structure; and
power terminals, located on and electrically connecting to the interconnection structure, wherein a size of each of at least a portion of the power terminals is greater than a size of each of the signal terminals, and a size of each of rest of the power terminals is substantially equal to the size of each of the signal terminals,
wherein the passive device is located on the first redistribution structure, the first redistribution structure is located between the passive device and the insulating encapsulation, and the interconnection structure is located between the first redistribution structure and the semiconductor substrate.

15. A method of manufacturing a package structure, comprising:
- providing a semiconductor substrate having an active surface;
- forming a first semiconductor device on the active surface of the semiconductor substrate;
- forming a first redistribution structure on the active surface of the semiconductor substrate, the first redistribution structure being electrically connected to the first semiconductor device;
- encapsulating the semiconductor substrate in an insulating encapsulation;
- forming conductive terminals over the first redistribution structure, the conductive terminals being electrically connected to the first redistribution structure, wherein the first redistribution structure is located between the semiconductor substrate and the conductive terminals;
- disposing a second redistribution structure over the first redistribution structure, the second redistribution structure connecting to the first redistribution structure and being between the first redistribution structure and the conductive terminals, the first redistribution structure being between the second redistribution structure and the semiconductor substrate; and
- forming a signal terminal and a power terminal on the first redistribution structure, the signal terminal and the power terminal being electrically coupled to the first redistribution structure, and a size of the signal terminal being less than a size of the power terminal, wherein the first redistribution structure is electrically connected to the second redistribution structure through the signal terminal and the power terminal.

16. The method of claim 15, wherein the second redistribution structure is disposed on a first surface of the insulating encapsulation, and is electrically connected to the first redistribution structure and the conductive terminals, the method further comprises:
- disposing a third redistribution structure on a second surface of the insulating encapsulation, the second surface being opposite to the first surface; and
- forming conductive pillars in the insulating encapsulation to electrically connect the second redistribution structure and the third redistribution structure,
- wherein encapsulating the semiconductor substrate in the insulating encapsulation comprises encapsulating the semiconductor substrate, the first redistribution structure and the first semiconductor device in the insulating encapsulation.

17. The method of claim 15, further comprising:
- forming an encapsulant over the insulating encapsulation, the insulating encapsulation is located between the encapsulant and the conductive terminals; and
- disposing antenna elements on the encapsulant, the antenna elements is electrically coupled to the first redistribution structure.

18. The method of claim 15, prior to encapsulating the semiconductor substrate in the insulating encapsulation, further comprising:
- forming an integrated circuit component, comprising:
  - providing the semiconductor substrate having the active surface;
  - forming the first semiconductor device on the active surface of the semiconductor substrate;
  - forming the first redistribution structure on the active surface of the semiconductor substrate, the first redistribution structure being electrically connected to the first semiconductor device; and
  - forming a signal terminal, the ground terminal and the power terminal on the first redistribution structure, the signal terminal, the ground terminal and the power terminal being arranged side-by-side to each other and electrically connected to the first redistribution structure, and the first redistribution structure being located between the signal terminal and the first semiconductor device,
- wherein a size of the signal terminal is less than a size of the power terminal, and wherein:
  - a size of the ground terminal is less than the size the power terminal while the size of the ground terminal is greater than or substantially equal to the size the signal terminal, or
  - a size of the ground terminal is substantially equal to the size the power terminal while the size of the ground terminal is greater than the size the signal terminal.

19. The package structure of claim 7, wherein the second semiconductor device and the conductive terminals are disposed at a side of the second redistribution structure opposing to the first redistribution structure.

20. The package structure of claim 12, further comprising:
- a semiconductor device, disposed over and electrically coupled to the first redistribution structure, wherein the semiconductor device and the conductive terminals are disposed at a side of the first redistribution structure opposing to the second redistribution structure.

* * * * *